(12) United States Patent
Shoji

(10) Patent No.: US 7,501,928 B2
(45) Date of Patent: Mar. 10, 2009

(54) CURRENT SENSOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 526 days.

(21) Appl. No.: 11/281,540

(22) Filed: Nov. 18, 2005

(65) Prior Publication Data

US 2006/0114098 A1 Jun. 1, 2006

(30) Foreign Application Priority Data

Nov. 30, 2004 (JP) .............................. 2004-345812

(51) Int. Cl.
*H01L 43/00* (2006.01)
(52) U.S. Cl. ................. 338/32 R; 324/117 R; 324/248; 360/324.11
(58) Field of Classification Search ............... 338/32 R; 324/248–249, 252, 117 R, 117 H; 360/324.11, 360/324.12
See application file for complete search history.

(56) References Cited

U.S. PATENT DOCUMENTS

| | | | |
|---|---|---|---|
| 4,464,625 A * | 8/1984 | Lienhard et al. | 324/117 R |
| 5,422,571 A * | 6/1995 | Gurney et al. | 324/252 |
| 5,621,377 A | 4/1997 | Dettmann et al. | |
| 6,614,211 B1 * | 9/2003 | Douglas | 324/67 |

FOREIGN PATENT DOCUMENTS

| | | |
|---|---|---|
| CH | 660 237 A5 | 3/1987 |
| DE | 40 31 560 A1 | 4/1992 |
| JP | A-01-105178 | 4/1989 |
| JP | A-05-10979 | 1/1993 |
| JP | A-06-294854 | 10/1994 |
| JP | A-10-506193 | 6/1998 |
| WO | WO 96/10186 | 4/1996 |

OTHER PUBLICATIONS

H. Lemme; Ein Modul fur alle Strombereiche, Magnetoresistive Stromsensoren kompakt wie noch nie; Sep. 7, 1999; pp. 71-72, 74.

* cited by examiner

*Primary Examiner*—Kyung Lee
(74) *Attorney, Agent, or Firm*—Oliff & Berridge, PLC

(57) ABSTRACT

The present invention provides a compact current sensor capable of measuring a current to be detected with high precision. A current sensor includes: a first magnetoresistive element including a plurality of element patterns which extend in an X axis direction at a first level, are disposed so as to be adjacent to each other in a Y axis direction orthogonal to the X axis direction, and are connected in parallel with each other; and a thin film coil which includes a plurality of winding body portions extending in the X axis direction in correspondence with the element patterns and winds at a second level different from the first level, and applies a current magnetic field to each of the element patterns when a current to be detected is supplied. Therefore, the absolute value of the resistance change amount in the magnetoresistive element increases. While realizing a compact configuration, the current to be detected, flowing in the thin film coil can be measured with high precision.

17 Claims, 16 Drawing Sheets

CURRENT SENSOR

TECHNICAL FIELD

The present invention relates to a small-sized current sensor capable of sensing a change in current flowing in a conductor with high sensitivity.

BACKGROUND OF THE INVENTION

Hitherto, to accurately detect small signal current flowing in a circuit in a communication device, for example, a method of connecting resistors in series in the circuit and measuring a voltage drop in the resistors is used. In this case, however, a load different from that in a communication system is applied, and there is the possibility that an adverse influence is exerted on the communication system. Consequently, a method of indirectly measuring signal current by detecting the gradient of a current magnetic field generated by the signal current (while maintaining an insulated state so that direct current does not flow) is used. Examples of such a method are a method of using a transformer in which coils are connected to each other and a method of using a photocoupler.

In the method of using the transformer, although a signal current which is an alternate current can be transmitted, a signal current which is a direct current cannot be transmitted. Moreover, a frequency band in which the signal current as the direct current can be transmitted is limited. At a frequency other than the proper frequency band, the impedance of the transformer changes, so that it lacks linearity, and an adverse influence may be exerted on the communication device and the like. On the other hand, the photocoupler has excellent frequency characteristics but it is difficult to reduce the size when the photocoupler is used. There is also a problem such that, thinking in long terms, deterioration in signal intensity caused by a change with time tends to occur.

Consequently, a current sensor in which a giant magnetoresistive element (hereinbelow, GMR element) producing giant magnetoresistive effect is disposed in the current magnetic field generated by signal current to detect the gradient of the current magnetic field has been proposed (refer to, for example, U.S. Pat. No. 5,621,377). A current sensor using such a GMR element has excellent detection sensitivity and responsiveness and can obtain detection characteristics which are stable also against a temperature change.

Recently, a current sensor capable of detecting weaker current and having a more compact general configuration is being demanded. In a conventional current sensor using conventional GMR elements, however, a GMR element is provided so as to be adjacent to a line to be measured in an in-plane direction, so that it is difficult to detect weak current and it is disadvantageous from the viewpoint of miniaturization.

SUMMARY OF THE INVENTION

The present invention has been achieved in consideration of such problems, and an object of the invention is to provide a current sensor capable of measuring a current to be detected with high precision while realizing a compact configuration.

A current sensor of the present invention has the following components (A) and (B):
(A) a first magnetoresistive element including a plurality of strip-shaped element patterns which extend in a first direction at a first level and are disposed so as to be adjacent to each other in a second direction orthogonal to the first direction
(B) a first thin film coil which includes a plurality of winding body portions extending in the first direction in correspondence with the element patterns in the first magnetoresistive element, winds at a second level different from the first level, and applies a first current magnetic field to each of the element patterns in the first magnetoresistive element when a current to be detected is supplied.

The strip-shaped denotes here a shape whose dimension in a first direction is larger than a dimension in a second direction.

In the current sensor of the invention, the first magnetoresistive element is disposed closer to the first thin film coil 31 in comparison with the case where the first magnetoresistive element and the first thin film coil are provided so as to be adjacent each other in the in-plane direction. Consequently, the whole dimension is reduced, and the first current magnetic field based on the current to be detected which flows in the first thin film coil is applied more strongly to the first magnetoresistive element. At this time, the first current magnetic field generated by the plurality of winding body portions of the first thin film coil corresponding to the plurality of element patterns of the first magnetoresistive element is applied to the plurality of element patterns. Therefore, optimization of the positions and dimensions in the cross section orthogonal to the first direction can be easily achieved from the viewpoint of heating by the coil and current efficiency of the coil magnetic field strength. As compared with the case of applying a current magnetic field generated only by a current flowing in one conductor (winding body portion) to each of the element patterns, the first current magnetic field can be effectively applied to each of the element patterns.

In the current sensor according to the invention, the element patterns in the first magnetoresistive element may be connected in parallel or series to each other.

The current sensor according to the invention may further comprise a second thin film coil which includes a plurality of winding body portions extending in the first direction in correspondence with the element patterns in the first magnetoresistive element and winds at a third level positioned on the side opposite to the second level with respect to the first level, and applies a second current magnetic field in the same direction as that of the first current magnetic field to each of the element patterns in the first magnetoresistive element when the current to be detected is supplied.

In addition to the first magnetoresistive element and the first thin film coil, the current sensor according to the invention may further comprise: a second magnetoresistive element including a plurality of strip-shaped element patterns which extend in the first direction and are disposed so as to be adjacent to each other in the second direction, and formed in an area other than an area in which the first magnetoresistive element at the first level is formed so as to be connected to the first magnetoresistive element; and a third thin film coil which includes a plurality of winding body portions extending in the first direction in correspondence with the element patterns in the second magnetoresistive element, winds in an area other than an area in which the first thin film coil at the second level is formed, and applies a third current magnetic field to each of the element patterns in the second magnetoresistive element when the current to be detected is supplied. In this case, preferably, the current sensor further comprises: a second thin film coil which includes a plurality of winding body portions extending in the first direction in correspondence with each of the element patterns of the first magnetoresistive element and winds at a third level positioned on the side opposite to the second level with respect to the first level, and applies a second current magnetic field in the same direction as that of the first current magnetic field to each of the element patterns in the first magnetoresistive element when the current to be detected is supplied; and a fourth thin film coil which includes a plurality of winding body portions extending in the first direction in correspondence with the element patterns in the second magnetoresistive element and winds in an area other than an area in which the second thin film coil at the third level is formed, and applies a fourth current magnetic field in the same direction as that of the third current magnetic field to each of the element patterns in the second magnetoresistive element when the current to be detected is supplied. In this case, preferably, a resistance value in each of the element patterns of the second magnetoresistive element changes in a direction opposite to that of a change in the resistance value of each of the element patterns of the first magnetoresistive element which is caused by the first and second current magnetic fields when the third and fourth current magnetic fields are applied. Further, preferably, the first and second magnetoresistive elements are formed on the same substrate.

In the current sensor of the invention, preferably, each of the element patterns in the first magnetoresistive element (and the second magnetoresistive element) has a magnetization pinned film magnetized in the first direction. Further, preferably, each of the element patterns in the first magnetoresistive element (and the second magnetoresistive element) has a longitudinal dimension in the first direction which is 10 to 200 times as large as a width dimension in the second direction. In this case, preferably, the width dimension lies in a range from 0.5 µm to 2.0 µm. Further, it is preferable that each of the winding body portions in the first and second thin film coils has a sectional area from 0.4 µm$^2$ to 2.0 µm$^2$ in a section orthogonal to the first direction. In particular, it is desirable that each of the winding body portions has a width in a range from 0.8 µm to 3.0 µm, and a thickness in a range from 0.2 µm to 1.4 µm.

The current sensor of the invention has: a first magnetoresistive element including a plurality of strip-shaped element patterns which extend in a first direction at a first level and are disposed so as to be adjacent to each other in a second direction orthogonal to the first direction; and a first thin film coil which includes a plurality of winding body portions extending in the first direction in correspondence with the element patterns in the first magnetoresistive element, winds at a second level, and applies a first current magnetic field to each of the element patterns in the first magnetoresistive element when a current to be detected is supplied. Consequently, while having a compact configuration, the current to be detected flowing in the first thin film can be measured with high sensitivity and high precision. In this case, in particular, by connecting the element patterns in the first magnetoresistive element in parallel with each other, the whole resistance value can be suppressed to be relatively low without decreasing the resistance change ratio in the first magnetoresistive element, and the heat generation amount of the first magnetoresistive element at the time of use can be reduced. Moreover, the influence of noise from the outside (unnecessary magnetic fields) can be reduced, and the S/N ratio can be improved. On the other hand, when the element patterns in the first magnetoresistive element are connected in series to each other, the total length of the element patterns functioning as a magnetosensitive part can be increased without increasing the dimension in the first direction, and the absolute values of general resistance values (impedances) in the first magnetoresistive element can be further increased. Therefore, high-precision measurement can be performed even with a weaker current to be detected.

When the current sensor according to the invention further includes a second thin film coil which includes a plurality of winding body portions extending in the first direction in correspondence with the element patterns in the first magnetoresistive element and winds at a third level positioned on the side opposite to the second level with respect to the first level as a reference, and applies a second current magnetic field in the same direction as that of the first current magnetic field to each of the element patterns in the first magnetoresistive element when the current to be detected is supplied, a combined magnetic field of the first and second current magnetic fields is applied to each of the element patterns. Thus, the absolute value of the resistance change amount in the first magnetoresistive element can be further increased, and the current to be detected can be measure with higher precision.

In addition to the first magnetoresistive element and the first thin film coil, the current sensor according to the invention further comprises: a second magnetoresistive element including a plurality of strip-shaped element patterns which extend in the first direction and are disposed so as to be adjacent to each other in the second direction, and formed in an area other than an area in which the first magnetoresistive element at the first level is formed so as to be connected to the first magnetoresistive element; and a third thin film coil which includes a plurality of winding body portions extending in the first direction in correspondence with the element patterns in the second magnetoresistive element, winds in an area other than an area in which the first thin film coil at the second level is formed, and applies a third current magnetic field to each of the element patterns in the second magnetoresistive element when the current to be detected is supplied. With the configuration, the current to be detected can be measured by both of the first and second magnetoresistive elements with higher precision. In this case, when it is constructed so that the resistance value in the element patterns in the second magnetoresistive element changes in the direction opposite to a change in the resistance value in the element patterns of the first magnetoresistive element generated by the first current magnetic field in accordance with the third current magnetic field, on the basis of the difference in the voltage drops which occur when the constant currents equal to each other do not flow to the first and second magnetoresistive elements, the current to be detected can be measured with higher precision. In addition, the current sensor may further comprise: a second thin film coil which includes a plurality of winding body portions extending in the first direction in correspondence with element patterns of the first magnetoresistive element and winds at a third level, and applies a second current magnetic field to each of the element patterns in the first magnetoresistive element when the current to be detected is supplied; and a fourth thin film coil which includes a plurality of winding body portions extending in the first direction in correspondence with the element patterns in the second magnetoresistive element and winds in an area other than an area in which the second thin film coil at the third level is formed, and applies a fourth current magnetic field in the same direction as that of the third current magnetic field to each of the element patterns in the second magnetoresistive element when the current to be detected is supplied. In the configuration, when the first and second current magnetic fields generated by the current to be detected are detected by the first magnetoresistive element and the third and fourth current magnetic fields generated by the current to be detected are detected by the second magnetoresistive element, while maintaining the compact configuration, the current to be detected flowing in the first to fourth thin film coils can be measured with higher precision by both of the first and second magnetoresistive elements.

BRIEF DESCRITION OF THE DRAWINGS

DETAILED DESCRIPTION OF THE PREFERRED EMBODIMENTS

Embodiments of the invention will be described in detail hereinbelow with reference to the drawings.

First Embodiment

Figure 1:
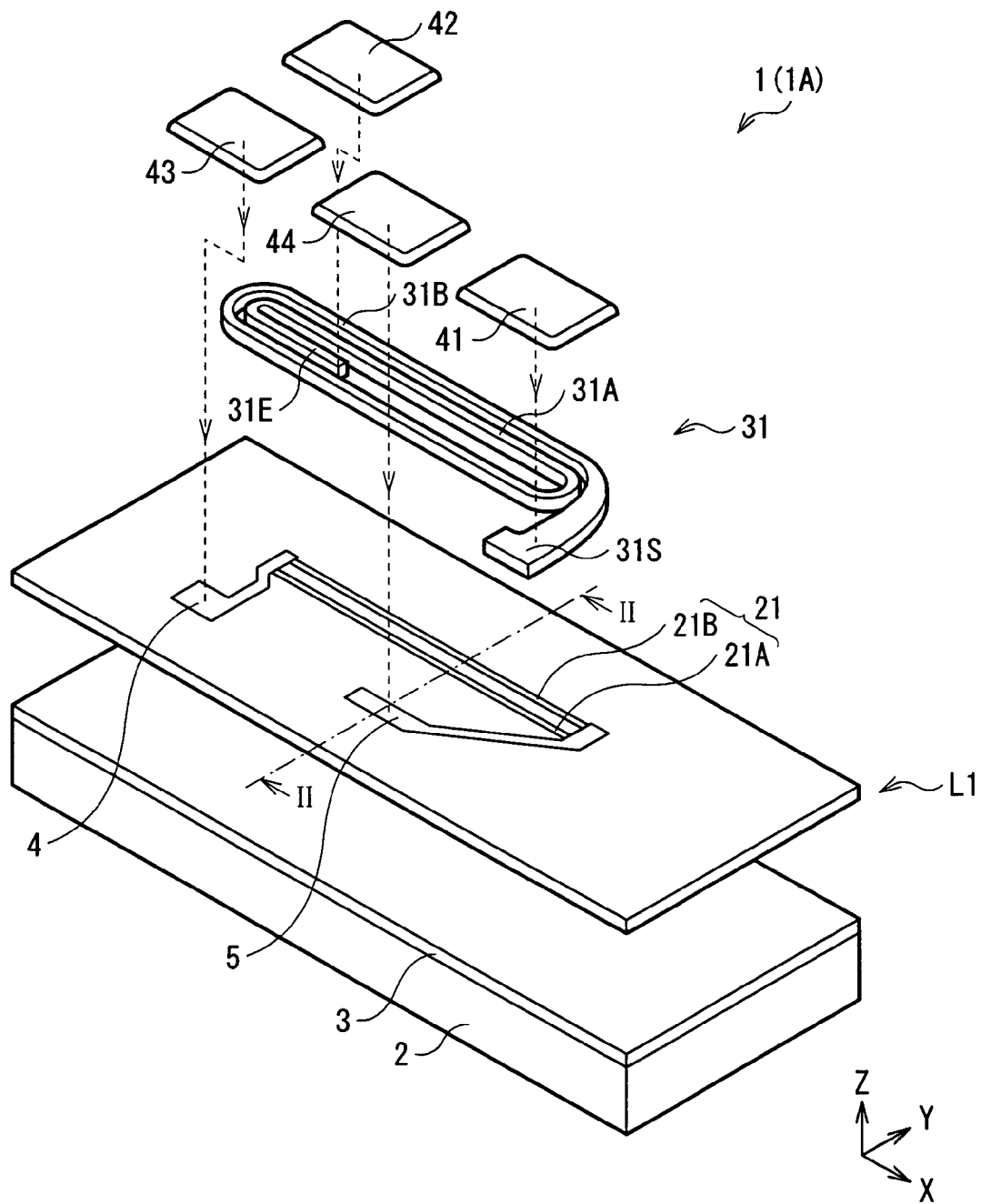
FIG. 1 is a perspective view showing the configuration of a current sensor according to a first embodiment of the invention.
Figure 2:
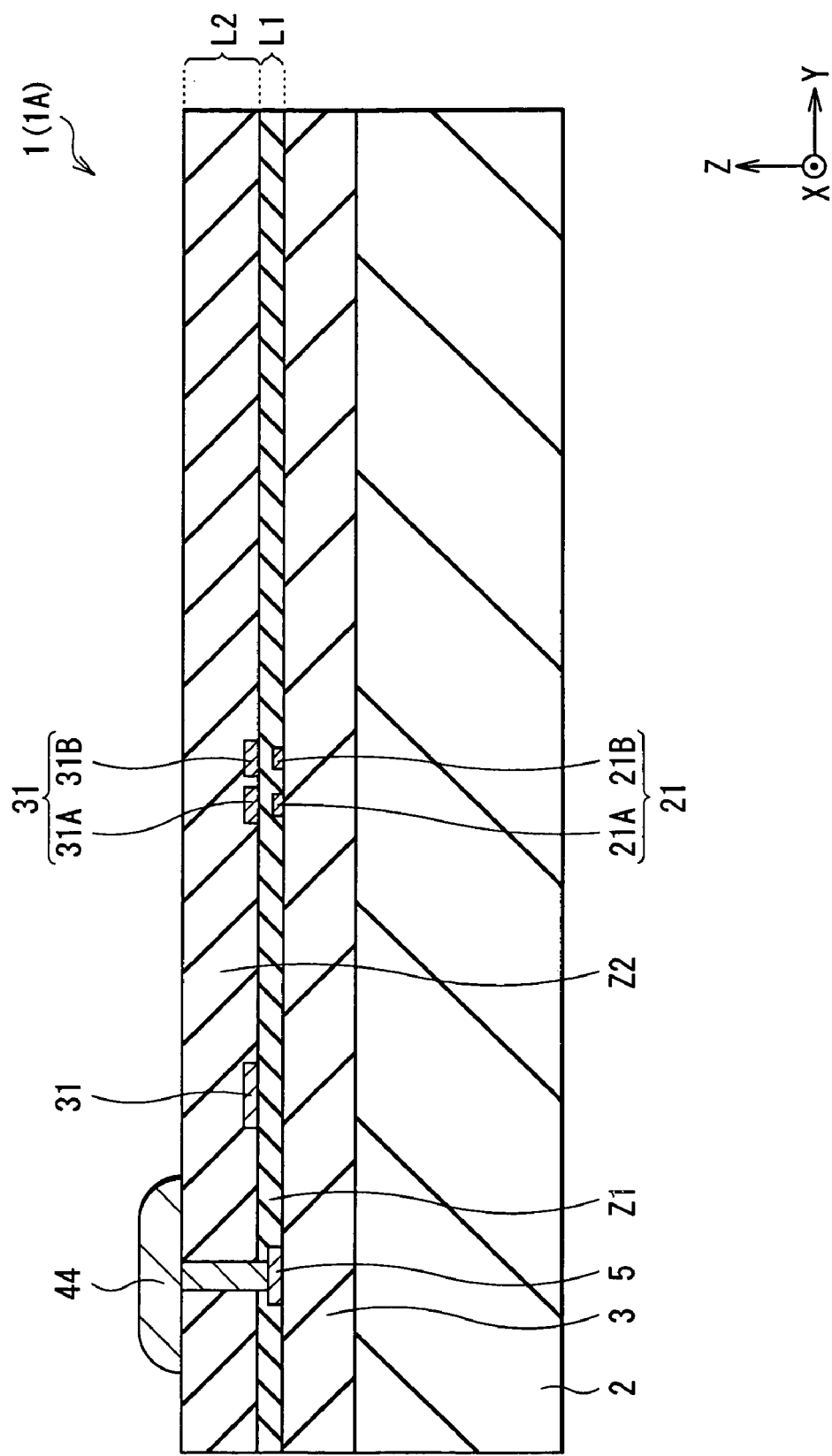
FIG. 2 is a cross section taken along line II-II of the current sensor illustrated in FIG. 1.

First, the configuration of a current sensor as a first embodiment of the invention will be described with reference to FIGS. 1 and 2. FIG. 1 is a schematic view illustrating a perspective configuration of a current sensor 1 according to the embodiment. FIG. 2 is a cross section taken along line II-II of the current sensor 1 illustrated in FIG. 1 seen from the direction indicated by the arrows (−X direction). The current sensor 1 is mounted on, for example, a communication device and is used for accurately measuring a current as a control signal. To distinguish the current sensor of the first embodiment from that of a second embodiment to be described later and the like, the current sensor in the first embodiment will be called a current sensor 1A.

The current sensor 1A includes a first magnetoresistive element 21 having two element patterns 21A and 21B extending in a first direction (X axis direction) at a first level L1, and a first thin film coil 31 (hereinbelow, simply called the thin film coil 31) including winding body portions 31A and 31B extending in the X axis direction in correspondence with the element patterns 21A and 21B in the first magnetoresistive element 21, respectively, and winding at a second level L2 different from the first level L1. Specifically, as shown in FIG. 2, the current sensor 1A has a structure obtained by sequentially stacking the first level L1 including the first magnetoresistive element 21 and the second level L2 including the thin film coil 31 over a substrate 2 made of silicon (Si) or the like via a base film 3 made of aluminum oxide ($Al_2O_3$) or the like. In the cross section of FIG. 2, the magnetoresistive element 21 and the thin film coil 31 are covered with insulating films Z1 and Z2 made of $Al_2O_3$ or the like, respectively, and electrically insulated from each other. Moreover, a plurality of electrode films 41 to 44 (shown in FIG. 1) are provided on the insulating film Z2.

The thin film coil 31 is a thin film pattern made of a metal material having high conductivity such as copper (Cu), and to which a current Im to be detected such as a control signal or the like is supplied. In the thin film coil 31, one end 31S is connected to the electrode film 41 via a contact layer (not shown) and the other end 31E is connected to the electrode film 42 via a contact layer (not shown) (refer to FIG. 1). The current sensor 1A is set so that the current Im to be detected flows from one end 31S to the other end 31E.

Both of the element patterns 21A and 21B detect first current magnetic fields Hm1 (which will be described later) generated by the current Im to be detected, and are provided in areas corresponding to the winding body portions 31A and 31B of the thin film coil 31, respectively in the stacking direction. The element patterns 21A and 21B are provided so as to extend in the X axis direction and be adjacent to each other in the Y axis direction (second direction) orthogonal to the X axis direction, and are connected in parallel to each other in electrode patterns 4 and 5. The electrode pattern 4 is connected to the electrode film 43 via a contact layer (not shown). On the other hand, the electrode pattern 5 is connected to the electrode film 44 via a contact layer (not shown). The element patterns 21A and 21B are formed so as to have a thickness of, for example, 0.8 μm by using sputtering or the like, and constructed so as to change a resistance value in accordance with the first magnetic field Hm1 generated by the current Im to be detected flowing in the thin film coils 31A and 31B when a read current flows to the element patterns 21A and 21B.

Figure 3:
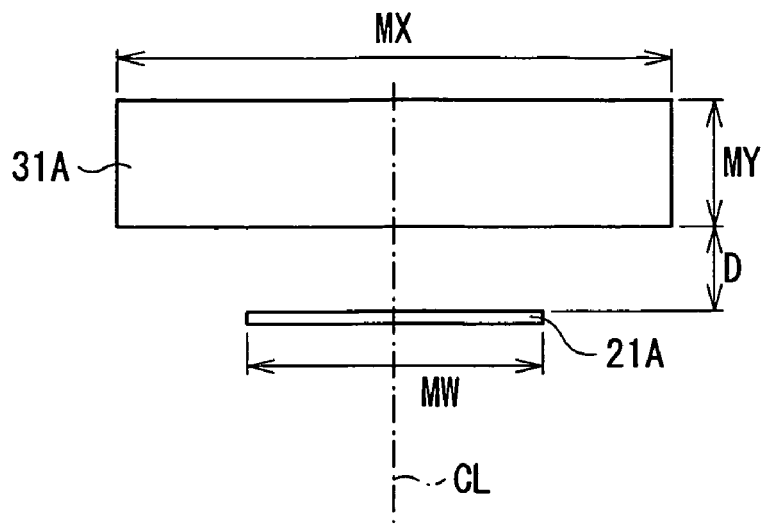
FIG. 3 is an enlarged cross section of a main part of FIG. 2.

FIG. 3 is an enlarged cross section showing a main part of FIG. 2. The winding body portion 31A and the element pattern 21A are representatively shown here. The winding body pattern 31A and the element pattern 21A are disposed so that their center positions in the Y axis direction coincide with each other (that is, each of the center positions exists on a virtual center line CL extending in the X axis direction) and disposed so as to be apart from each other by a distance D in the Z axis direction. It is preferable that the distance D is 0.2 μm or more from the viewpoint of insulation resistance. Specifically, if the thickness of an insulating film Z1 by which the winding body portion 31A and the element pattern 21A are separated from each other is 0.2 µm or more, they can withstand instantaneous application of 700V. From the viewpoint of realization of compactness, it is preferable that the distance D is as small as possible. Concretely, it is preferable that the thickness be equal to or less than 1.0 µm.

The range of a cross section area S on a YZ cross section (a cross section orthogonal to the X axis direction) of the winding body portion 31A is preferably from 0.4 µm² to 2.0 µm². When the cross section area S is less than 0.4 µm², there is the possibility that excessive temperature rise (for example, exceeding 1.0° C.) is caused by the current Im to be detected flowing in the winding body portion 31A (since the current sensor 1A of the embodiment detects a control signal of a communication device or the like, the magnitude of the current Im to be detected is about 2 mA to 50 mA), and detection precision deteriorates. On the other hand, when the cross section area S exceeds 2.0 µm², the strength of the current magnetic fields Hm1 decreases so that it becomes difficult to obtain stable detecting operation by the element pattern 21A.

The winding body portion 31A having such a cross section area S is constructed, for example, to have a width MX in a range from 0.8 µm to 3.0 µm, and a thickness MY which is from 0.2 µm to 1.4 µm in the YZ cross section orthogonal to the X axis direction. A width MW in the Y axis direction of the element pattern 21A is preferably 2.0 µm or less so that a current magnetic field Hm1 which is sufficiently uniform as a whole in the Y axis direction is applied to the element pattern 21A. On the other hand, the lower limit of the width MW is preferably 0.5 µm so that a film which is uniform in the Y axis direction is formed. Although only the winding body portion 31A and element pattern 21A are shown in FIG. 3, it is preferable that the winding body portion 31B and the element pattern 21B have the same configuration.

Figure 4:
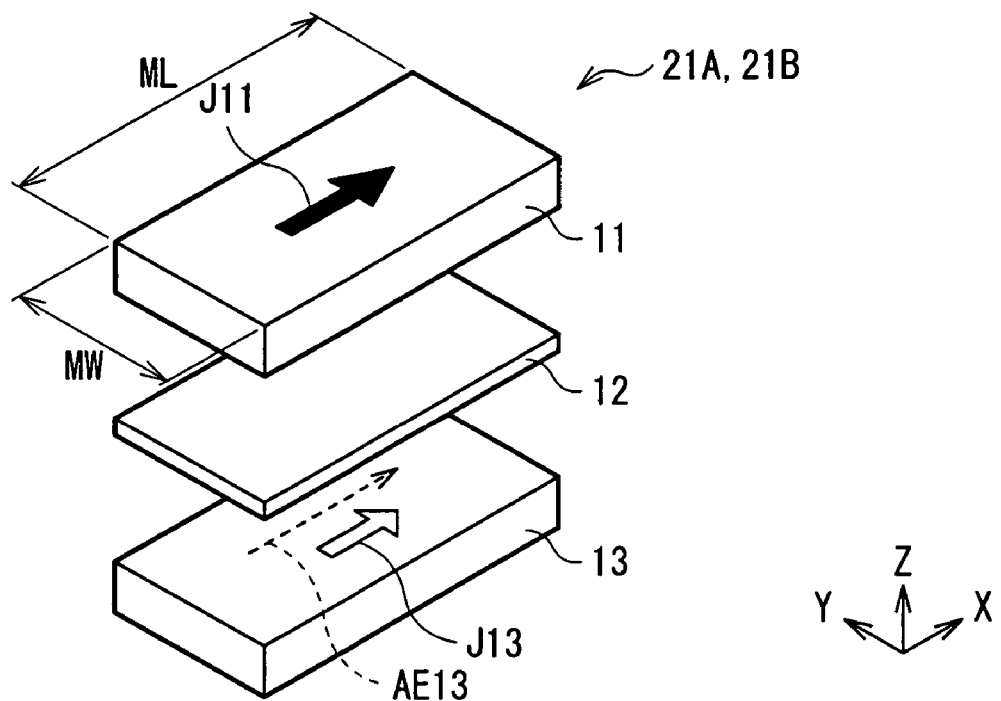
FIG. 4 is an exploded perspective view showing the configuration of a magnetoresistive element as a main part of the current sensor illustrated in FIG. 1.

Next, the configuration of the element patterns 21A and 21B will be described more specifically with reference to FIGS. 4 to 7. FIG. 4 is an exploded perspective view showing the configuration of the element patterns 21A and 21B. The ratio of dimensions does not coincide with the actual one.

As shown in FIG. 4, each of the element patterns 21A and 21B has a spin valve structure in which a plurality of function films including magnetic layers are stacked. Each of the element patterns 21A and 21B includes a pinned layer 11 having a magnetization direction J11 pinned in the +X direction, a free layer 13 whose magnetization direction J13 changes according to external magnetic fields H such as the current magnetic field Hm1, and an intermediate layer 12 which is sandwiched between the pinned layer 11 and the free layer 13 and does not show any specific magnetization direction. The free layer 13 is made of a soft magnetic material such as nickel iron alloy (NiFe). The intermediate layer 12 is made of copper (Cu) and has a top face that is in contact with the pinned layer 11 and an under face that is in contact with the free layer 13. The intermediate layer 12 can be made of, other than copper, a nonmagnetic metal having high conductivity such as gold (Au). Each of the top face of the pinned layer 11 (the face on the side opposite to the intermediate layer 12) and the under face of the free layer 13 (the face on the side opposite to the intermediate layer 12) is protected with a not-shown protection film. Exchange bias magnetic fields Hin in the magnetization direction J11 (hereinbelow, simply called "exchange bias magnetic fields Hin") are generated between the pinned layer 11 and the free layer 13 which act on each other via the intermediate layer 12. The strength of the exchange bias magnetic field Hin changes as the spin direction in the free layer 13 rotates according to the interval between the pinned layer 11 and the free layer 13 (that is, the thickness of the intermediate layer 12). Although FIG. 4 shows a configuration example of the case where the free layer 13, the intermediate layer 12, and the pinned layer 11 are stacked in order from the bottom, the invention is not limited to the configuration. The layers may be stacked in the opposite order.

The element patterns 21A and 21B are constructed so that a length ML in the X axis direction (dimension in the longitudinal direction) is 10 times to 200 times as large as the width MW in the Y axis direction (dimension in width). Concretely, a preferable range of the length ML is, for example, from 20 µm to 100 µm. In such a manner, each of the element patterns 21A and 21B has a strip shape having the length ML which is large relative to the width MW, so that magnetic shape anisotropy is displayed along the Y axis direction. Therefore, in the case where external magnetic fields H are applied in the +Y direction (or −Y direction), linearity of change in the resistance change ratio is improved for change in the external magnetic fields H. In this case, when the length ML (longitudinal dimension) is less than 10 times as large as the width MW (width dimension) in the Y axis direction, a sufficient shape anisotropy magnetic field can not be obtained. On the other hand, the case where the length ML is more than 100 times as large as the width MW is not preferable for the reasons that improvement of a shape anisotropy magnetic field is not expected and a noise occurs due to increase in the resistance value.

Figure 5:
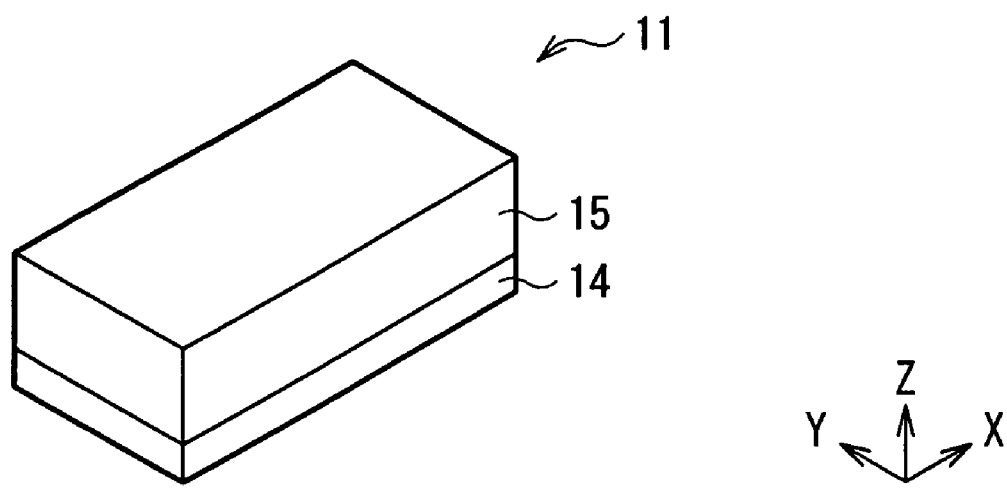
FIG. 5 is a perspective view showing the configuration of a part of the magnetoresistive element illustrated in FIG. 4.

FIG. 5 shows a detailed configuration of the pinned layer 11. The pinned layer 11 has a configuration in which a magnetization pinned film 14 and an antiferromagnetic film 15 are stacked in order from the side of the intermediate layer 12. The magnetization pinned film 14 is made of a ferromagnetic material such as cobalt (Co) or cobalt iron alloy (CoFe). The magnetization direction of the magnetization pinned film 14 is the magnetization direction J11 of the pinned layer 11 as a whole. The antiferromagnetic film 15 is made of an antiferromagnetic material such as platinum manganese alloy (PtMn) or iridium manganese alloy (IrMn). The antiferromagnetic film 15 is in the state where the spin magnetic moment in the +X direction and that in the opposite direction (−X direction) completely cancel out each other, and functions so as to pin the magnetization direction J11 of the magnetization pinned film 14.

In the element patterns 21A and 21B constructed as described above, the magnetization direction J13 of the free layer 13 rotates by application of the current magnetic field Hm1, thereby changing a relative angle between the magnetization directions J13 and J11. The relative angle is determined according to the magnitude and direction of the current magnetic field Hm1.

Figure 6:
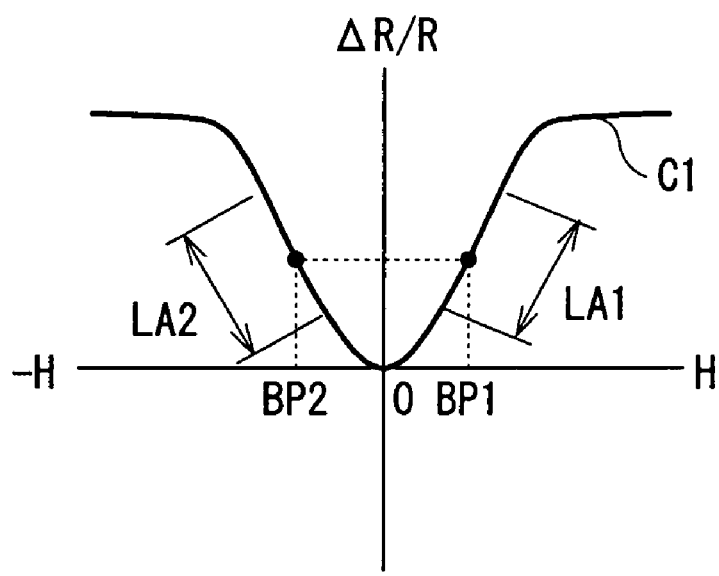
FIG. 6 is a characteristic diagram showing magnetic field dependency of a resistance change ratio in the magnetoresistive element illustrated in FIG. 4.

FIG. 4 shows a no load state where the current magnetic field Hm1 is zero (Hm=0) and the other magnetic fields (such as the bias magnetic field) are not applied (that is, the state where the external magnetic field H is zero). Since an easy magnetization axis direction AE13 of the free layer 13 is set so as to be parallel with the magnetization direction J11 of the pinned layer 11, all of the easy magnetization axis direction AE13 and the magnetization directions J13 and J11 are parallel with each other along the +X direction in this state. Consequently, the spin directions of magnetic domains in the free layer 13 align in almost the same direction. In the case where the external magnetic field H is applied to the element patterns 21A and 21B in the direction orthogonal to the magnetization direction J11 (+Y direction or −Y direction), characteristics as shown in FIG. 6 are obtained. FIG. 6 shows the relation between the external magnetic field H and the resistance change ratio AR/R when the external magnetic field H in the Y direction is assumed to be positive. The relation is expressed by a curve C1 which hardly shows hysteresis and in which the resistance change ratio ΔR/R is the smallest (ΔR/R=0) at the external magnetic field H of zero (H=0). In this case, 1/f noise caused by hysteresis is extremely small, so that high-sensitive and stable sensing can be performed.

Figure 7:
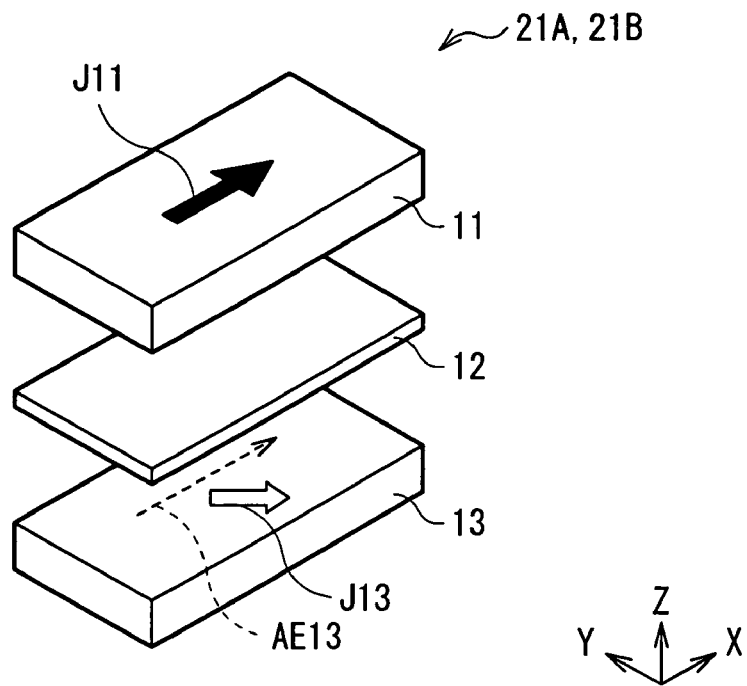
FIG. 7 is another exploded perspective view showing the configuration of the magnetoresistive element as a main part of the current sensor illustrated in FIG. 1.

As is evident from FIG. 6, however, a linear change cannot be obtained around zero of the external magnetic field H(H=0). Therefore, in the case of actually measuring the current magnetic field Hm1, by applying a bias magnetic field generated by a not-shown permanent magnet or the like in a direction orthogonal to the magnetization direction J11, as shown in FIG. 7, the magnetization direction J13 is turned to be slightly tilted so as to include a component in the +Y direction or a component in the −Y direction (FIG. 7 shows the case where the magnetization direction J13 is tilted to the −Y direction). In such a manner, a change in the current magnetic field Hm1 can be detected with high precision in a linear area LA1 having a bias point BP1 as a center or a linear area LA2 having a bias point BP2 as a center shown in FIG. 6.

Figure 8:
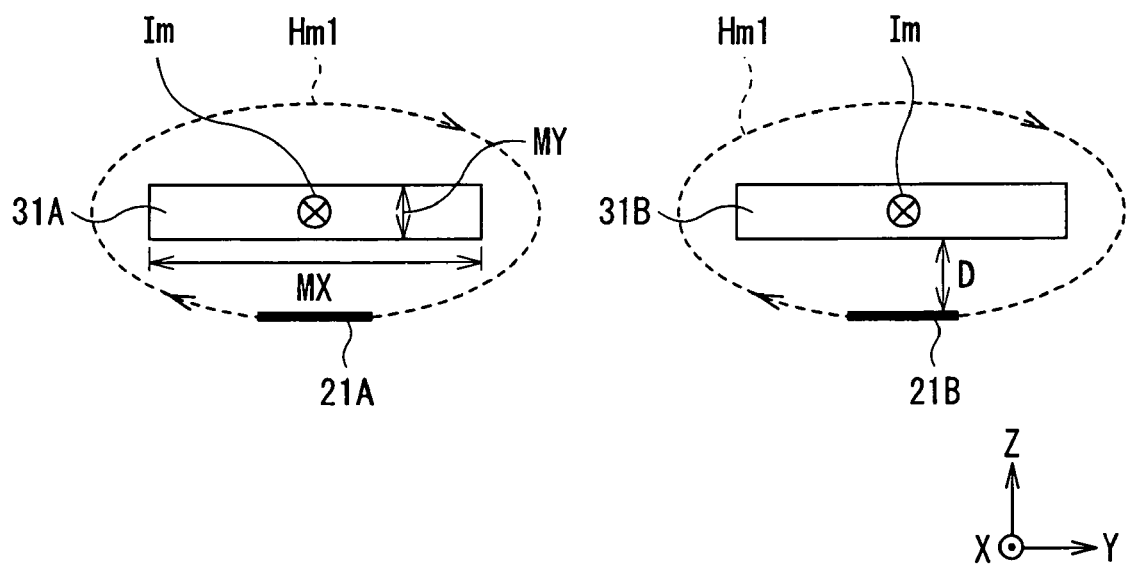
FIG. 8 is another enlarged cross section of a main part of FIG. 2.

In the case of performing sensing by using the current sensor 1A having such a configuration, first, a sense current flows to the element patterns 21A and 21B via the electrode films 43 and 44. Next, the current Im to be detected is supplied to the thin film coil 31 via the electrode films 41 and 42, and the current magnetic field Hm1 generated by the winding body portions 31A and 31B is detected by the of element patterns 21A and 21B. Specifically, for example, when the current Im to be detected flows from the end 31S toward the end 31E of the thin film coil 31, as shown in FIG. 8, the current Im to be detected flows in the winding body portions 31A and 31B in the −X direction (from this side to the back in the drawing sheet). As a result, the current magnetic field Hm1 winding around each of the winding body portions 31A and 31B (in a clockwise direction in the drawing sheet) according to the right-handed screw rule is generated. Consequently, the current magnetic field Hm1 in the −Y direction is applied to each of element patterns 21A and 21B, so that resistance values in the element patterns 21A and 21B change. By detecting a change amount of a voltage drop between the electrode patterns 4 and 5 (the change amount of the resistance value), the magnitude of the current Im to be detected can be estimated.

As described above, the current sensor 1A of the embodiment has: the first magnetoresistive element 21 including the element patterns 21A and 21B provided so as to extend in the X axis direction at the first level L1 and to be adjacent to each other in the Y axis direction orthogonal to the X axis direction, and connected in parallel to each other; and the thin film coil 31 including the winding body portions 31A and 31B which extend in the X axis direction in correspondence with the element patterns 21A and 21B, respectively, winding at the second level L2 different from the first level L1, and applying the current magnetic field Hm1 to each of the element patterns 21A and 21B when the current Im to be detected is supplied. Consequently, the first magnetoresistive element 21 and the thin film coil 31 are disposed closer to each other in comparison with the case where they are provided so as to be adjacent each other in the in-plane direction such as the case where the first magnetoresistive element 21 and the thin film coil 31 are provided at the same level.

Further, by the winding body portions 31A and 31B of the thin film coil 31, the current magnetic field Hm1 can be individually applied to the element patterns 21A and 21B of the first magnetoresistive element 21 corresponding to the winding body portions 31A and 31B, respectively. Consequently, optimization of the positions and dimensions in the cross section orthogonal to the first direction can be easily achieved from the viewpoint of heating by the coil and current efficiency of the coil magnetic field strength. As compared with the case of applying a current magnetic field generated only by a current flowed in one conductor (winding body portion) to each of the element patterns, the current magnetic field Hm1 can be effectively applied to each of the element patterns 21A and 21B. As a result, the current Im to be detected can be detected with high sensitivity.

In particular, the element patterns 21A and 21B are connected in parallel to each other, so that the resistance value of the whole first magnetoresistive element 21 can be suppressed to be relatively low without decreasing the resistance change ratio, and the heat generation value at the time of use can be reduced. Moreover, the influence of noise from the outside (unnecessary magnetic fields) can be reduced, and the S/N ratio can be improved. For the above reasons, the current sensor 1A can measure the current Im to be detected flowing in the thin film coil 31 with high precision while realizing the compact configuration.

Second Embodiment

Subsequently, a current sensor 1B as a second embodiment of the invention will be described with reference to FIGS. 9 and 10.

Figure 9:
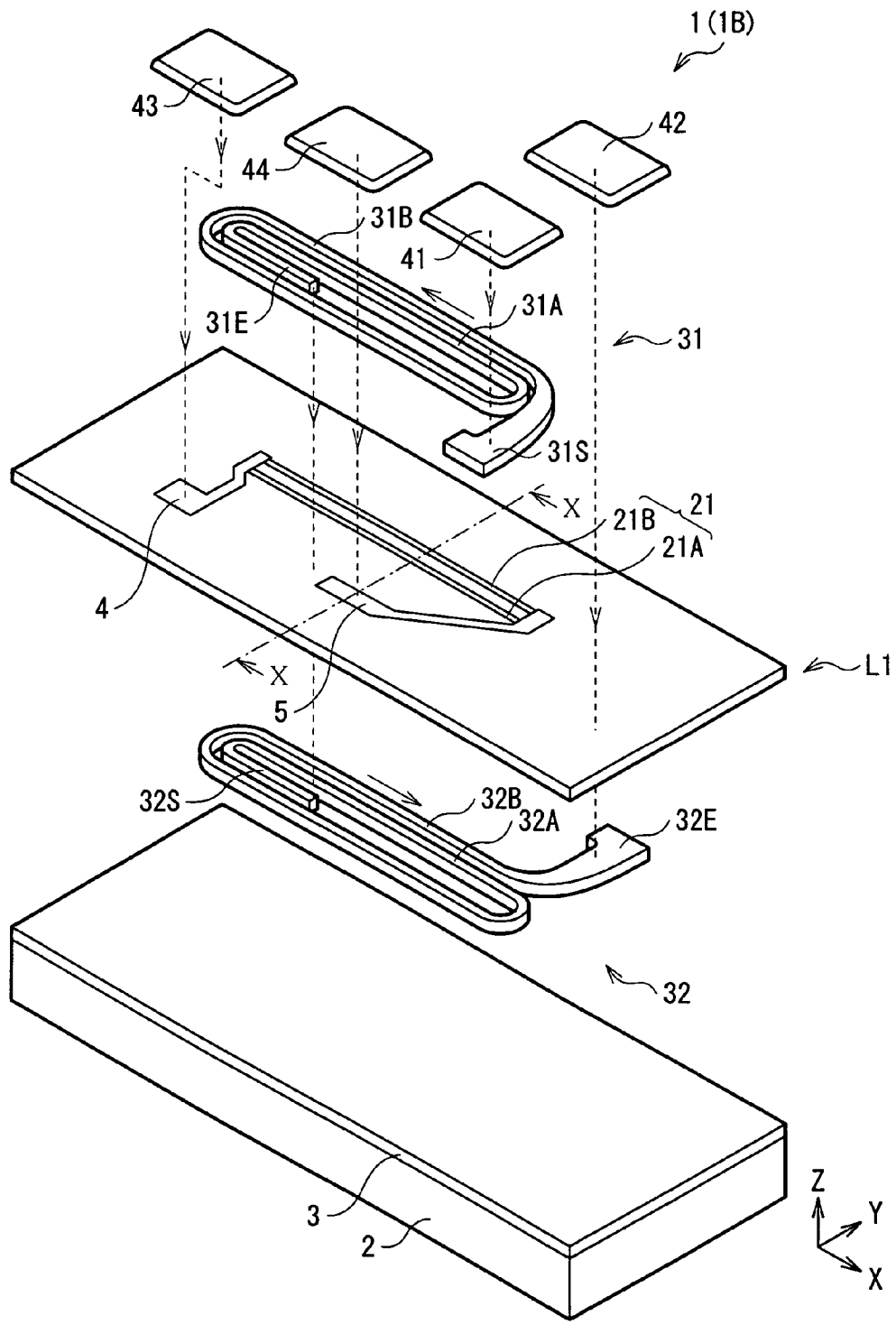
FIG. 9 is a perspective view showing the configuration of a current sensor according to a second embodiment of the invention.
Figure 10:
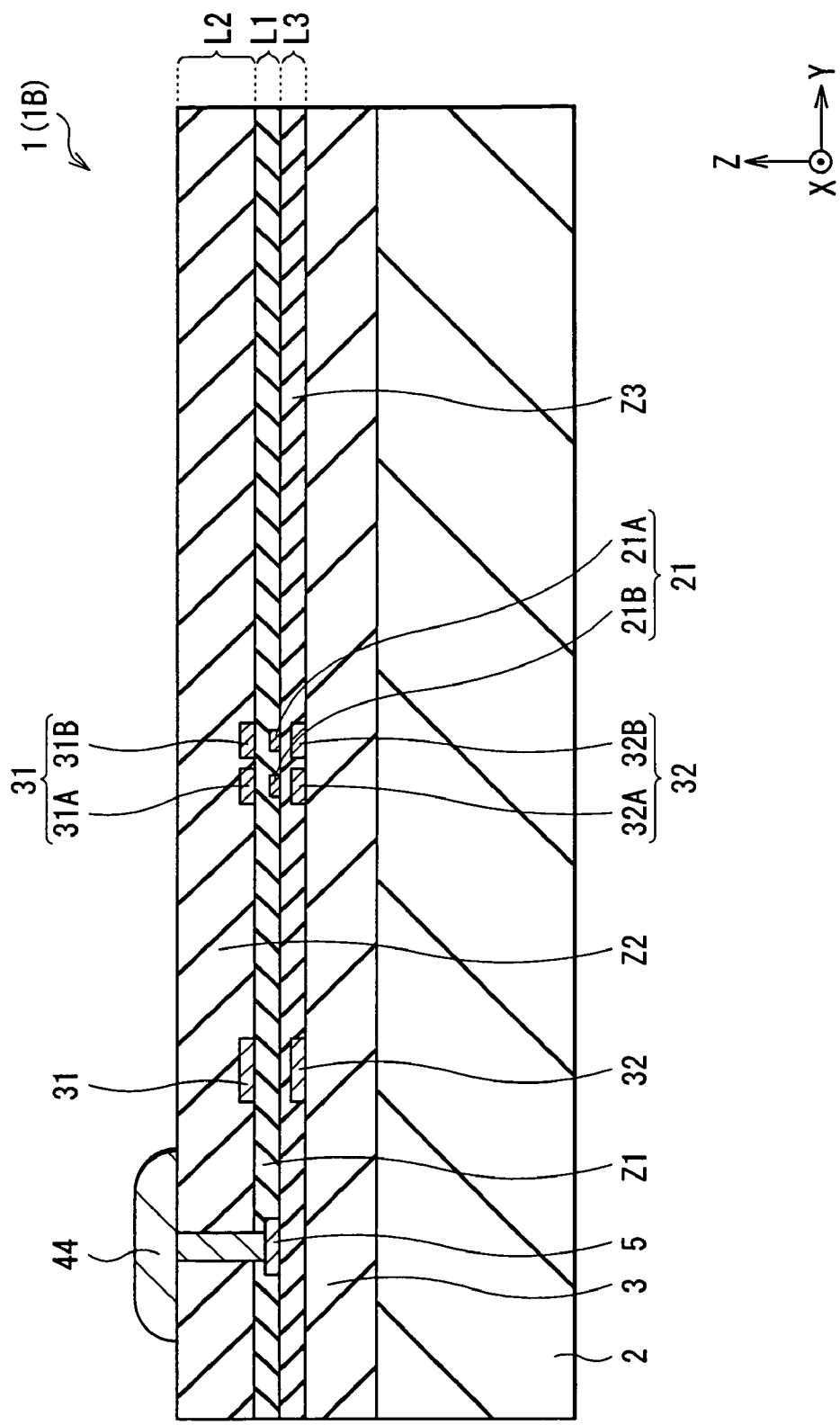
FIG. 10 is a cross section taken along line X-X of the current sensor illustrated in FIG. 9.

FIG. 9 is schematic view illustrating a perspective configuration of the current sensor 1B. FIG. 10 shows a sectional configuration taken along line X-X of the current sensor 1B in FIG. 9 seen from the direction indicated by the arrows (−X direction). The current sensor 1B is obtained by adding a second thin film coil 32 (hereinbelow, simply called the thin film coil 32) to the current sensor 1A of the foregoing embodiment.

Concretely, in the current sensor 1B, a third level L3 positioned on the side opposite to the second level L2 with respect to the first level L1 is provided and the thin film coil 32 is formed so as to be buried in an insulating film Z3 at the third level L3. Specifically, as shown in FIG. 10, the current sensor 1B has a structure obtained by sequentially stacking the third level L3 including the thin film coil 32, the first level L1 including the first magnetoresistive element 21, and the second level L2 including the thin film coil 31 on the substrate 2 made of silicon or the like via the base film 3 made of aluminum oxide ($Al_2O_3$) or the like. In the cross section of FIG. 10, the thin film coil 32, the first magnetoresistive element 21, and the film coil 31 are covered with the insulating films Z3, Z1, and Z2 made of $Al_2O_3$ or the like, respectively, and are electrically insulated from each other.

The thin film coil 32 is, like the thin film coil 31, a thin film pattern made of a metal material having high conductivity such as copper (Cu). The thin film coil 32 winds and includes winding body portions 32A and 32B extending in the X axis direction in correspondence with the element patterns 21A and 21B of the first magnetoresistive element 21 at the third level L3. The thin film coil 32 applies a second current magnetic field Hm2 in the same direction as that of the current magnetic field Hm1 (hereinbelow, simply called the current magnetic field Hm2) to each of the element patterns 21A and 21B when the current Im to be detected is supplied. The end 31E of the thin film coil 31 is connected to one end 32S of the thin film coil 32 via a contact layer (not shown). The other end 32E of the thin film coil 32 is connected to the electrode film 42 via a contact layer (not shown). Therefore, the thin film coils 31 and 32 are formed as one conductor in the circuit configuration.

Figure 11:
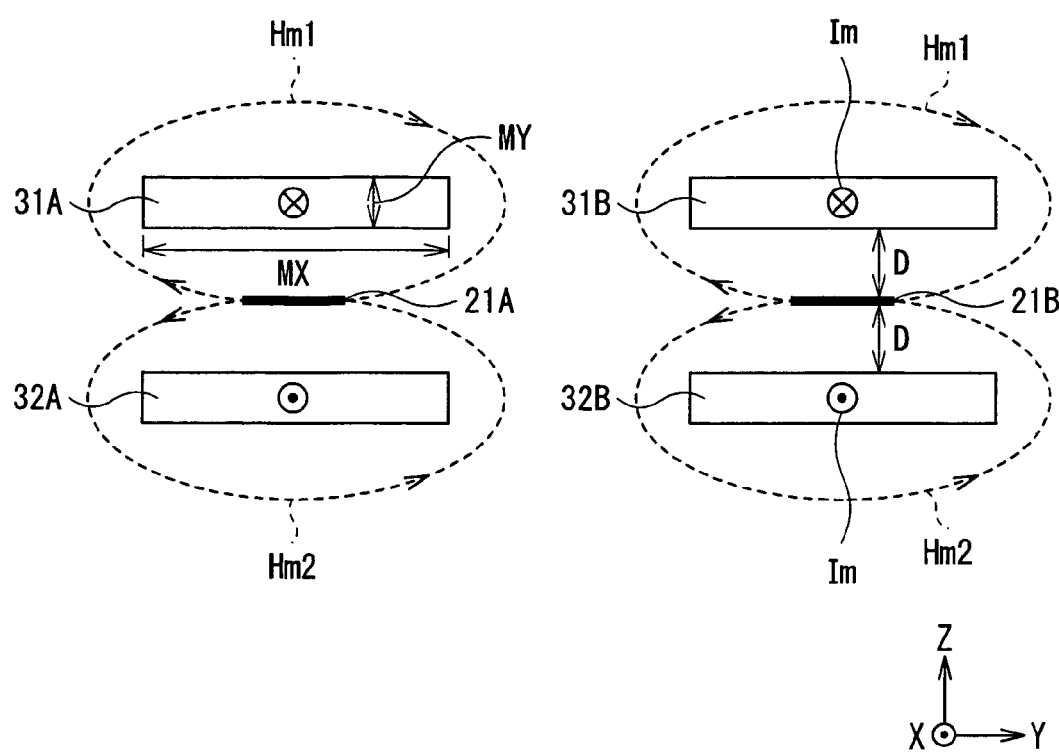
FIG. 11 is an enlarged cross section of a main part of FIG. 10.

In the current sensor 1B having such a configuration, by passing one current Im to be detected to the thin film coils 31 and 32, as shown in FIG. 11, the two current magnetic fields Hm1 and Hm2 act on the first magnetoresistive element 21. FIG. 11 is an enlarged view of a part of FIG. 10 and a diagram illustrating the actions of the current magnetic fields Hm1 and Hm2 to the element patterns 21A and 21B.

In the case of sensing by using the current sensor 1B, first, a sense current flows to the element patterns 21A and 21B via the electrode films 43 and 44. Next, the current Im to be detected is supplied to the thin film coils 31 and 32 via the electrode films 41 and 42. Both of the current magnetic field Hm1 generated by the winding body portions 31A and 31B and the current magnetic field Hm2 generated by the winding body portions 32A and 32B are detected by the element patterns 21A and 21B, respectively. For example, when the current Im to be detected flows from the end 31S toward the end 31E in the thin film coil 31 and, subsequently, from the end 32S toward the end 32E in the thin film coil 32, as shown in FIG. 11, the current Im to be detected flows in −X direction (from this side to the back in the drawing sheet) in the winding body portions 31A and 31B. As a result, the current magnetic field Hm1 winding around each of the winding body portions 31A and 31B (in a clockwise direction in the diagram) is generated according to the right-handed screw rule. On the other hand, the current Im to be detected flows in the +X direction (from the back to this side in the drawing sheet) in the winding body portions 32A and 32B. As a result, the current magnetic field Hm2 winding around each of the winding body portions 32A and 32B (in an anticlockwise direction in the diagram) is generated according to the right-handed screw rule. Consequently, a combined magnetic field of the current magnetic fields Hm1 and Hm2 in the −Y direction is applied to each of the element patterns 21A and 21B, so that the strength of the magnetic field applied to each of the element patterns 21A and 21B is larger in comparison with the case of applying only the current magnetic field Hm1, and the change amount in the resistance value increases. In a manner similar to the first embodiment, a change amount in the voltage drop between the electrode patterns 4 and 5 (a change amount in the resistance value) is detected, so that the magnitude of the current Im to be detected can be estimated.

As described above, the current sensor 1B of the second embodiment includes the thin film coil 32 constructed so as to apply the current magnetic field Hm2 in the same direction as that of the current magnetic field Hm1 to the element patterns 21A and 21B. Therefore, the composite magnetic field of the first and second current magnetic fields is applied to each of the element patterns 21A and 21B, so that the absolute value of the resistance change amount in the first magnetoresistive element 21 can be further increased, and the current Im to be detected can be measured with higher precision.

Third Embodiment

Figure 12:
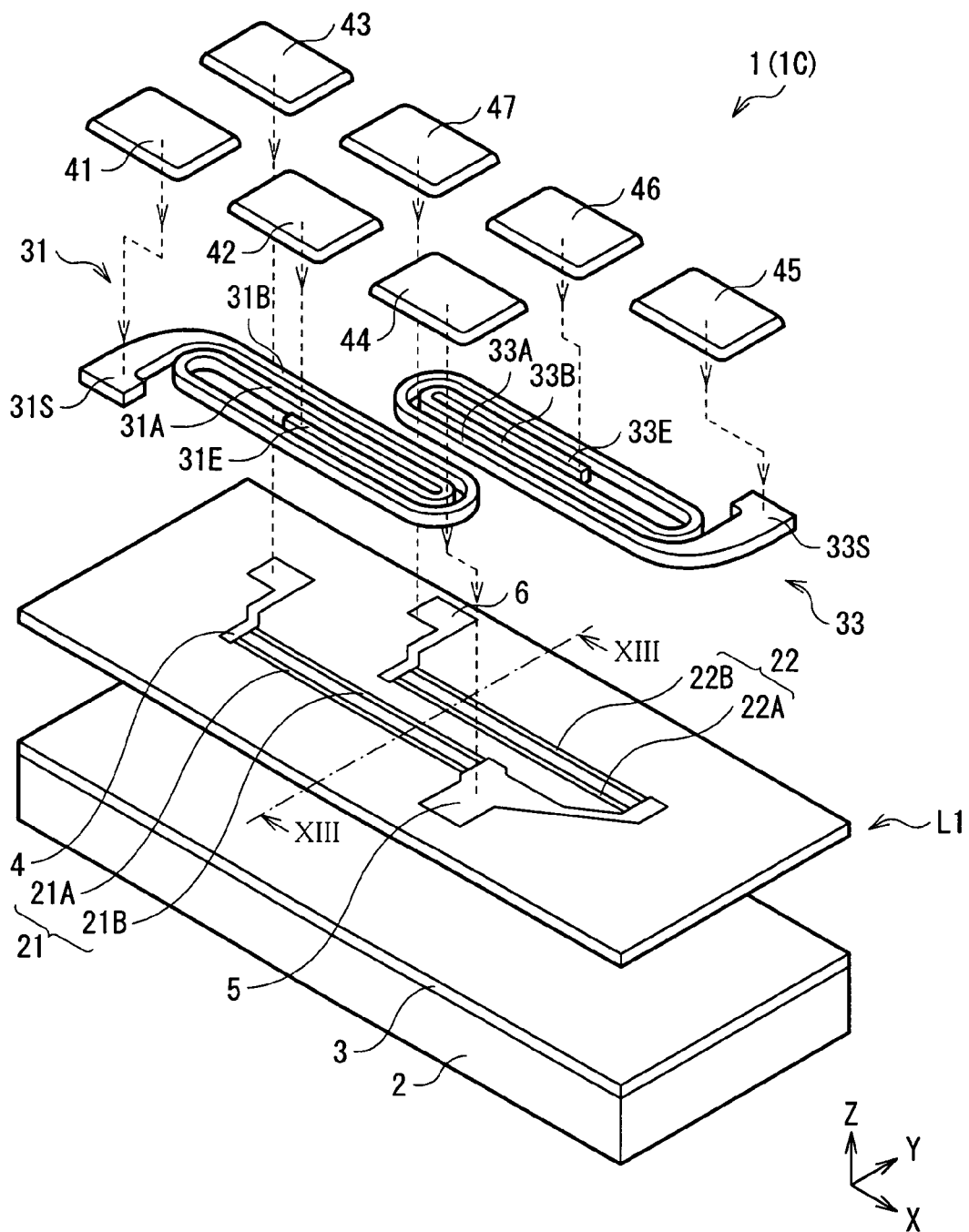
FIG. 12 is a perspective view showing the configuration of a current sensor according to a third embodiment of the invention.
Figure 13:
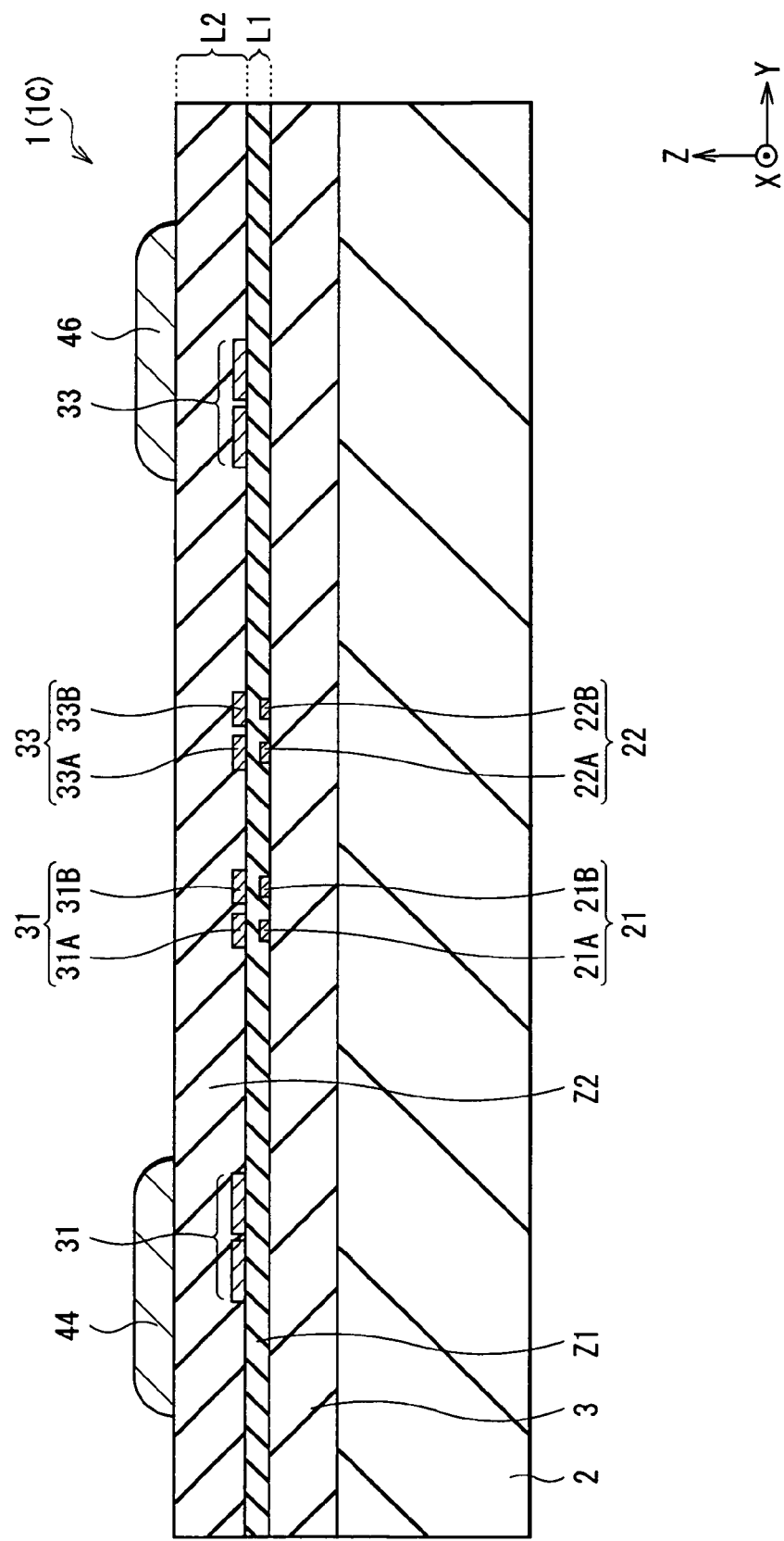
FIG. 13 is a cross section taken along line XIII-XIII of the current sensor illustrated in FIG. 12.

Subsequently, a current sensor 1C as a third embodiment of the invention will be described with reference to FIGS. 12 to 15. FIG. 12 is a schematic view illustrating a perspective configuration of the current sensor 1C. FIG. 13 shows a sectional configuration taken along line XIII-XIII of the current sensor 1C in FIG. 12 seen from the direction indicated by the arrows (−X direction).

The current sensor 1C is obtained by adding a second magnetoresistive element 22 and a third thin film coil 33 (hereinbelow, simply called the thin film coil 33) to the configuration of the current sensor 1A of the foregoing first embodiment. It will be concretely described hereinbelow but description of parts overlapping with those of the first embodiment will not be repeated.

As shown in FIG. 12, in the current sensor 1C, the second magnetoresistive element 22 having the element patterns 22A and 22B is disposed so as to be adjacent to the first magnetoresistive element 21 in the Y axis direction at the first level L1, and is connected to the first magnetoresistive element 21. Both of the element patterns 22A and 22B are provided so as to extend in the X axis direction and be adjacent to each other in the Y axis direction, and are connected in parallel to each other. Further, in the current sensor 1C, the thin film coil 33 winds and includes winding body portions 33A and 33B extending in the X axis direction in correspondence with the element patterns 22A and 22B at the second level L2. Specifically, as shown in FIG. 13, the current sensor 1C has a structure obtained by sequentially stacking the first level L1 including the first and second magnetoresistive elements 21 and 22 and the second level L2 including the thin films coil 31 and 33 on the substrate 2 made of silicon or the like via the base film 3 made of $Al_2O_3$ or the like. In the cross section of FIG. 13, the first and second magnetoresistive elements 21 and 22, and the thin film coils 31 and 33 are covered with the insulating film Z1 and an insulating film Z2 made of $Al_2O_3$ or the like, respectively, and electrically insulated from each other. Further, a plurality of electrode films 41 to 47 (shown in FIG. 12) are provided over the insulating film Z2.

The thin film coil 33 is a thin film pattern made of a metal material having high conductivity such as copper (Cu). One end 33S is connected to the electrode film 45 via a contact layer (not shown), and the other end 33E is connected to the electrode film 46 via a contact layer (not shown). In this case, the current Im to be detected is set so as to flow from one end 33S to the other end 33E.

Figure 14:
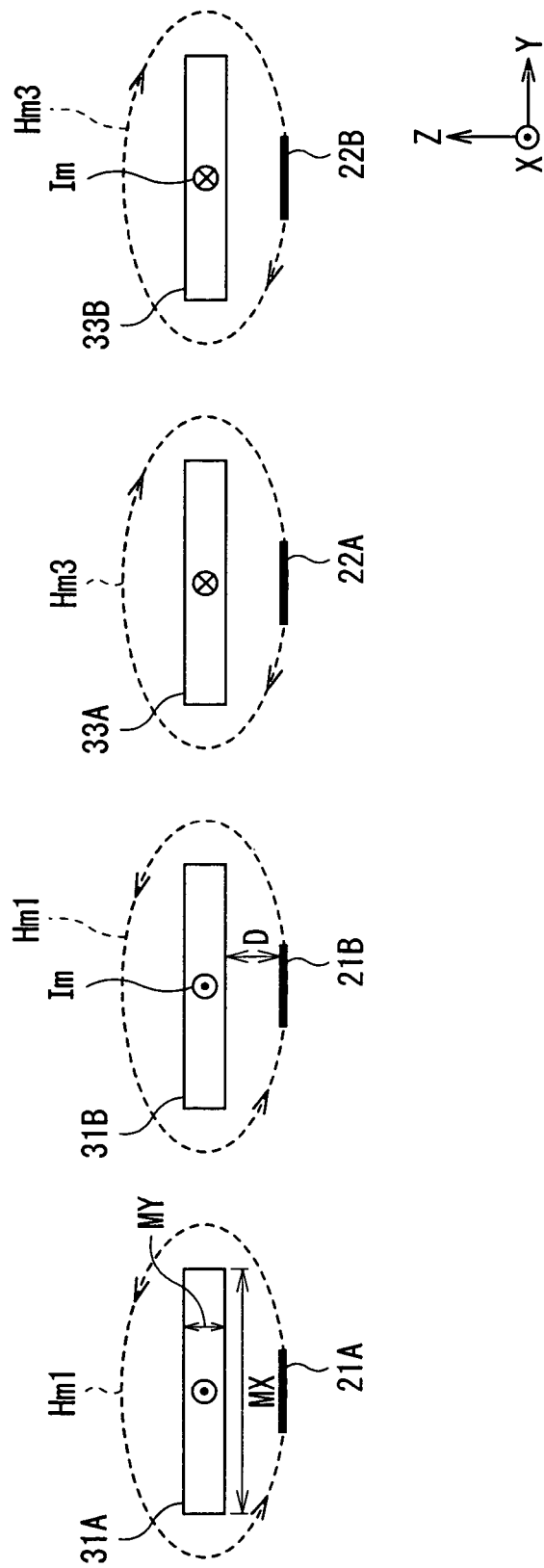
FIG. 14 is an enlarged cross section of a main part of FIG. 13.

The element patterns 22A and 22B are provided to detect a third current magnetic field Hm3 (which will be described later) generated by the current Im to be detected and, as shown in FIG. 13, are provided in areas corresponding to the winding body portions 33A and 33B of the thin film coil 33, respectively in the stacking direction. The element patterns 22A and 22B are provided so as to extend in the X axis direction and be adjacent to each other in the Y axis direction, and are connected in parallel to each other in the electrode pattern 5 and an electrode pattern 6. The electrode pattern 5 is connected to the electrode film 44 via a contact layer (not shown), and the electrode pattern 6 is connected to the electrode film 47 via a contact layer (not shown). When a read current flows to each of the element patterns 22A and 22B, a change occurs in the resistance value in accordance with the current magnetic fields Hm3 generated by the current Im to be detected flowing in the thin film coils 33A and 33B. The element patterns 22A and 22B are constructed so that when the current magnetic field Hm3 is applied, the resistance value changes in the direction opposite to that of a change in the element patterns 21A and 21B generated by the current magnetic field Hm1. For example, a bias magnetic field having strength corresponding to the bias point BP1 (refer to FIG. 6) is preliminarily applied in the +Y direction to each of the element patterns 21A and 21B and the element patterns 22A and 22B in the first and second magnetoresistive elements 21 and 22. When the current Im to be detected flows in the +X direction as shown in FIG. 14, the current magnetic field Hm1 in the +Y direction is applied to the element patterns 21A and 22B. Consequently, as is evident from FIG. 6, the resistance change ratio increases (the resistance value increases). On the other hand, the current magnetic field Hm3 in the −Y direction is applied to the element patterns 22A and 22B. Consequently, as is evident from FIG. 6, the resistance change ratio decreases (the resistance value decreases). In this configuration, the dimensions of the thin film coils 31 and 33 in the YZ cross section are equal to each other. Further, the distances D in the stacking direction (the Z axis direction) between the thin film coils 31 and 33 and the first and second magnetoresistive elements 21 and 22 are equal to each other. Therefore, the absolute value of the current magnetic field Hm1 applied to the element patterns 21A and 21B and that of the current magnetic field Hm3 applied to the element patterns 22A and 22B are equal to each other. FIG. 14 is an enlarged view of a part of FIG. 13 and illustrates actions of the current magnetic fields Hm1 and Hm3 to the element patterns 21A and 21B and the element patterns 22A and 22B.

Figure 15:
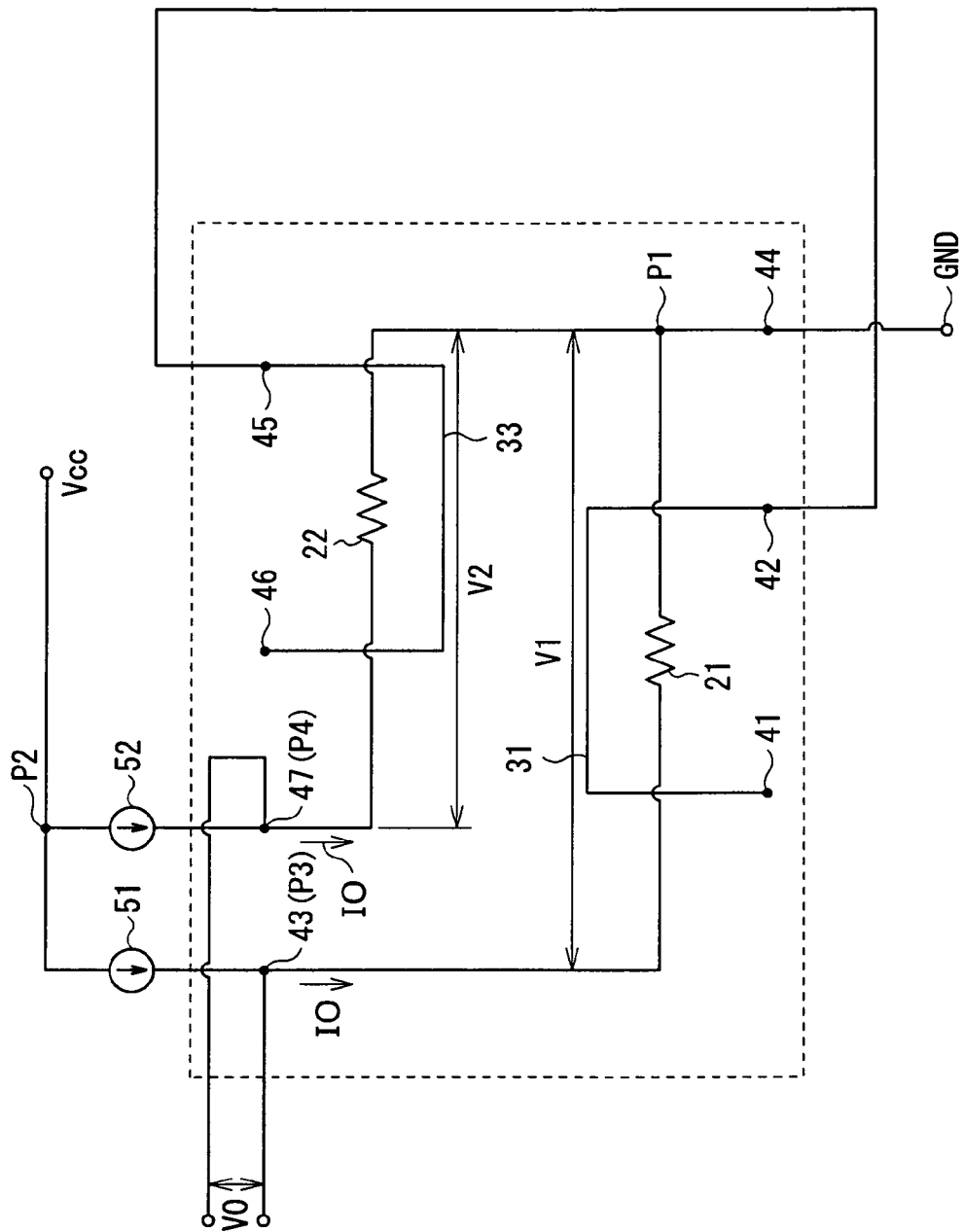
FIG. 15 is a circuit diagram corresponding to the current sensor illustrated in FIG. 12.

FIG. 15 is a schematic diagram showing a circuit configuration of an ammeter including the current sensor 1C shown in FIGS. 12 and 13. In FIG. 15, a portion surrounded by a broken line corresponds to the current sensor 1C. As shown in FIG. 15, the first magnetoresistive element 21 and thin film coil 31 are disposed close to each other, and the second magnetoresistive element 22 and thin film coil 33 are disposed close to each other. In this configuration, the first and second magnetoresistive elements 21 and 22 are expressed as resistors in which a plurality of element patterns is connected in parallel to each other. The first and second magnetoresistive elements 21 and 22 are coupled to each other at a first connection point P1 (the electrode pattern 5) and finally grounded via the electrode film 44. On the side opposite to the first connection point P1 of the first and second magnetoresistive elements 21 and 22, constant current sources 51 and 52 which are coupled to each other at a second connection point P2 are provided. Concretely, the end on the side opposite to the first connection point P1 in the first magnetoresistive element 21 is connected to the constant current source 51 via the electrode film 43 as a third connection point P3. The end on the side opposite to the first connection point P1 in the second magnetoresistive element 22 is connected to the constant current source 52 via the electrode film 47 as a fourth connection point P4. The constant current sources 51 and 52 supply constant currents I0 whose values are equal to the first and second magnetoresistive elements 21 and 22. The thin film coils 31 and 33 are connected to each other via a conductor connecting the electrode films 42 and 45 to function as one conductor.

In the current sensor 1C having such a configuration, when a voltage is applied across the first and second connection points P1 and P2, the magnitude of the current magnetic fields Hm1 and Hm3 can be obtained on the basis of the potential difference V0 between the third and fourth connection points P3 and P4 (the difference between a voltage drop occurring in the first magnetoresistive element 21 and a voltage drop occurring in the second magnetoresistive element 22), and the magnitude of the current Im to be detected which generates the current magnetic fields of the same magnitude can be estimated.

In FIG. 15, constant currents from the constant current sources 51 and 52 when a predetermined voltage is applied across the first and second connection points P1 and P2 are expressed as I0 and the resistance values of the whole magnetoresistive elements 21 and 22 are expressed as R1 and R2, respectively. In the case where the current magnetic fields Hm1 and Hm3 are not applied, a potential V1 at the third connection point P3 (the electrode film 43) is expressed as follows $$V1 = I0 \cdot R1$$

A potential V2 at the fourth connection point P4 (the electrode film 47) is expressed as follows.

$$V2 = I0 \cdot R2$$

Therefore, the potential difference between the third and fourth connection points P3 and P4 is expressed by the following equation.

$$V0 = V1 - V2 \qquad (1)$$
$$= I0 \cdot R1 - I0 \cdot R2$$
$$= I0 \cdot (R1 - R2)$$

In this circuit, by measuring the potential difference V0 when the current magnetic fields Hm1 and Hm3 are applied, the resistance change amounts in the magnetoresistive elements 21 and 22 are obtained. For example, it is assumed that when the current magnetic fields Hm1 and Hm3 are applied, the resistance values R1 and R2 increase only by change amounts $\Delta R1$ and $\Delta R2$, respectively, Equation (1) is calculated as follows.

$$V0 = V1 - V2 \qquad (2)$$
$$= I0 \cdot (R1 - R2)$$
$$= I0 \cdot \{(R1 + \Delta R1) - (R2 + \Delta R2)\}$$

As already described above, the first magnetoresistive element 21 (the element patterns 21A and 21B) and the second magnetoresistive element 22 (the element patterns 22A and 22B) are disposed so that the resistance values R1 and R2 change in directions opposite to each other in accordance with the current magnetic fields Hm1 and Hm3. Accordingly, the positive and negative signs of the change amounts $\Delta R1$ and $\Delta R2$ are opposite to each other. Therefore, in Equation (2), while the resistance values R1 and R2 before application of the current magnetic fields Hm1 and Hm3 cancel out each other, the change amounts $\Delta R1$ and $\Delta R2$ are maintained as they are.

When it is assumed that the first and second magnetoresistive elements 21 and 22 have the same characteristics, that is, R1=R2=R and $\Delta R1 = -\Delta R2 = \Delta R$, Equation (2) is calculated as follows.

$$V0 = I0 \cdot (R1 + \Delta R1 - R2 - \Delta R2) \qquad (3)$$
$$= I0 \cdot (R + \Delta R - R + \Delta R)$$
$$= I0 \cdot (2\Delta R)$$

Therefore, by using the first and second magnetoresistive elements 21 and 22 in which the relation between an external magnetic field and a resistance change amount is grasped in advance, the magnitudes of the current magnetic fields Hm1 and Hm3 can be measured, and the magnitude of the current Im to be detected which generates the current magnetic fields Hm1 and Hm3 having the measured magnitudes can be estimated. In this case, sensing is performed by using the two first and second magnetoresistive elements 21 and 22, so that the resistance change amount which is twice as large as that in the case of performing sensing using the first magnetoresistive element 21 or the second magnetoresistive element 22 singly can be obtained. Thus, the invention is advantageous to realize higher precision of a measurement value.

As described above, the current sensor 1C of the third embodiment has, particularly, the second magnetoresistive element 22 which is formed at the first level L1 and includes the element patterns 22A and 22B connected in parallel to each other, and the thin film coil 33 which is formed so as to wind at the second level L2, includes the winding body portions 32A and 32B corresponding to the element patterns 22A and 22B, respectively, and applies the current magnetic field Hm3 to each of the element patterns 22A and 22B. Therefore, in addition to the effects of the foregoing first embodiment, the current to be detected can be measured with higher precision by both of the first and second magnetoresistive elements 21 and 22. In this configuration, the current magnetic field Hm3 is applied to the element patterns 22A and 22B, thereby changing the resistance value R2 in the direction opposite to a change in the resistance value R1 of the element patterns 21A and 21B generated by the current magnetic fields Hm1. Thus, on the basis of the voltage drop difference V0, which occurs when the constant currents are I0 equal to each other and flow to the magnetoresistive elements 21 and 22, the current Im to be detected can be measured with higher precision.

Fourth Embodiment

Subsequently, a current sensor 1D as a fourth embodiment of the invention will be described with reference to FIGS. 16 and 17.

The current sensor 1D is obtained by adding second and fourth thin film coils 32 and 34 (hereinbelow, simply called the thin film coils 32 and 34) to the configuration of the current sensor 1B in the third embodiment. The thin film coil 32 has a configuration similar to that described in the second embodiment. The current sensor 1D of the fourth embodiment will be concretely described hereinbelow but description of parts overlapping with those in the first to third embodiments will not be repeated.

Figure 16:
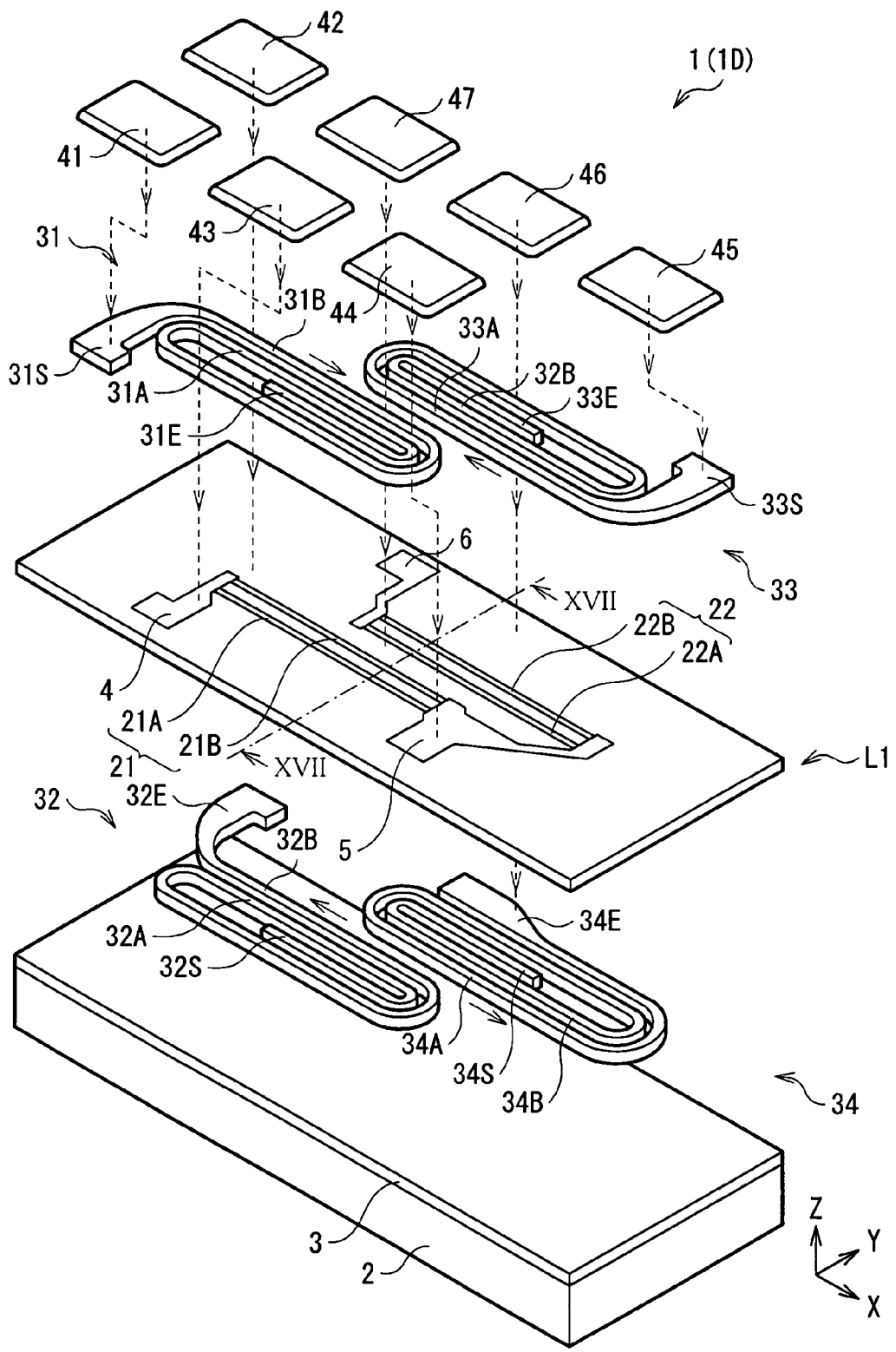
FIG. 16 is a perspective view showing the configuration of a current sensor according to a fourth embodiment of the invention.
Figure 17:
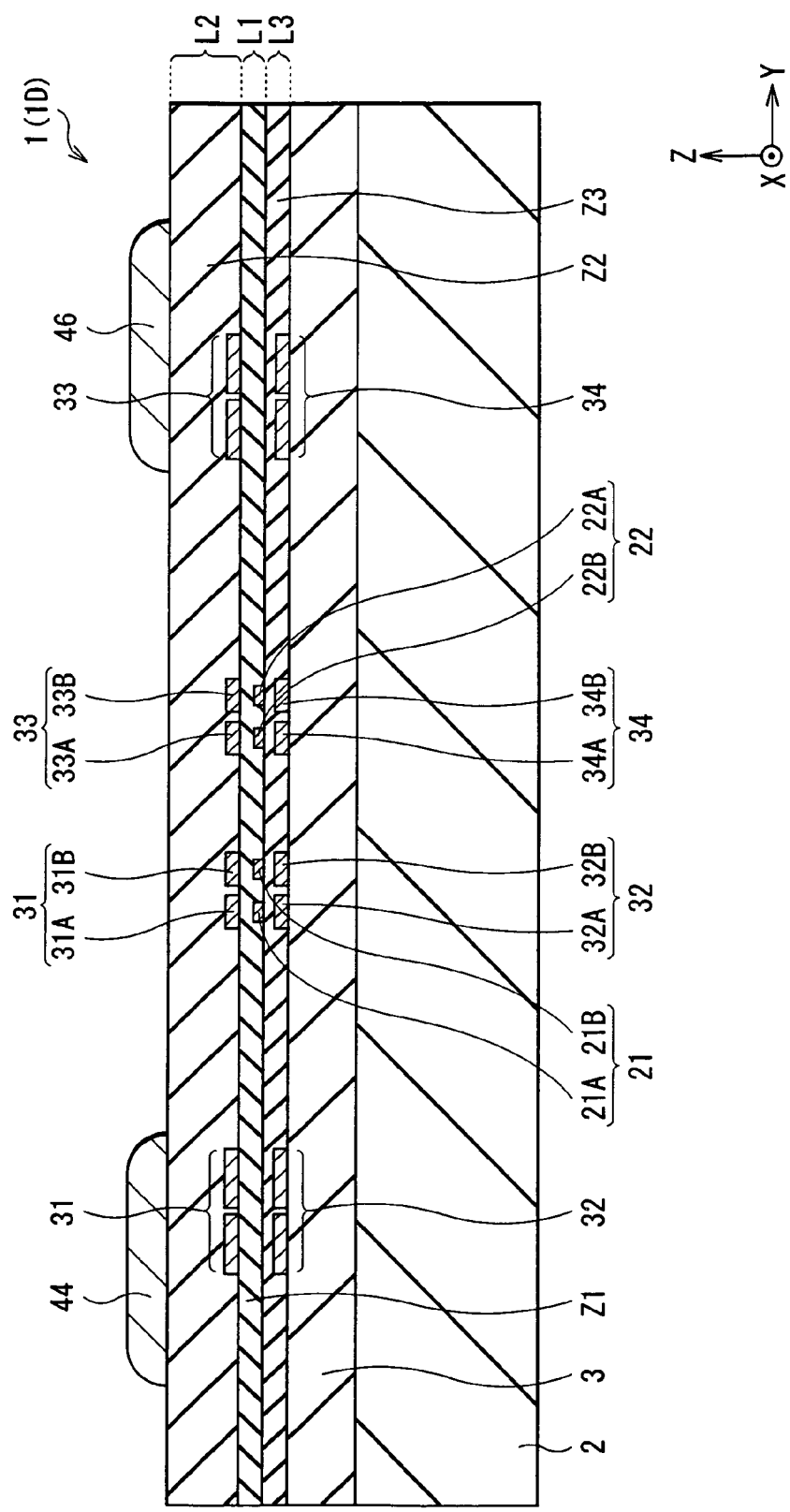
FIG. 17 is a cross section taken along line XVII-XVII of the current sensor illustrated in FIG. 16.

FIG. 16 is a schematic view illustrating a perspective configuration of the current sensor 1D of the fourth embodiment. FIG. 17 shows a sectional configuration taken along line XVII-XVII of the current sensor 1D of FIG. 16 seen from the direction indicated by the arrows (−X direction).

In the current sensor 1D, the second magnetoresistive element 22 is formed in an area other than the area in which the first magnetoresistive element 21 is formed at the first level L1. The second magnetoresistive element 22 includes element patterns 22A and 22B which extend in the X axis direction to be adjacent to each other in the Y axis direction and to be connected in parallel to each other. The second magnetoresistive element 22 is formed so as to be connected to the first magnetoresistive element 21 in series. On the side opposite to the thin film coil 33 of the second magnetoresistive element 22, the thin film coil 34 winds in an area other than the area in which the thin film coil 32 is formed at the third level L3. Specifically, as shown in FIG. 17, the current sensor 1C has a structure obtained by sequentially stacking the third level L3 including the thin film coils 32 and 34, the first level L1 including the first and second magnetoresistive elements 21 and 22, and the second level L2 including the thin films coil 31 and 32 on the substrate 2 made of silicon or the like via the base film 3 made of $Al_2O_3$ or the like. In the cross section of FIG. 17, the thin film coils 32 and 34, the first and second magnetoresistive elements 21 and 22, and the thin film coils 31 and 33 are covered with the insulating films Z3, Z1 and Z2 made of $Al_2O_3$ or the like, respectively, and electrically insulated from each other. Further, a plurality of electrode films 41 to 47 (shown in FIG. 16) are provided over the insulating film Z2.

The thin film coil 33 is constructed so as to apply the current magnetic field Hm3 to the electrode patterns 22A and 22B when the current Im to be detected is supplied. One end 33S is connected to the electrode film 45 via a contact layer (not shown), and the other end 33E is connected to an end 34S of the thin film coil 34 (refer to FIG. 16). The thin film coil 34 includes winding body portions 34A and 34B extending in the X axis direction in correspondence with the element patterns 22A and 22B, respectively. When the current Im to be detected is supplied, the thin film coil 34 applies a fourth current magnetic field Hm4 having the same direction as the current magnetic field Hm3 (hereinbelow, simply called the fourth current magnetic field Hm4) to the element patterns 22A and 22B. One end 34S of the thin film coil 34 is connected to the end 33E via a contact layer (not shown), and the other end 34E is connected to the electrode film 46 via a contact layer (not shown) (refer to FIG. 16). Therefore, the thin film coils 33 and 34 are formed in a single conductor in the circuit configuration. Further, the electrode films 42 and 45 may be connected to each other via an external conductor (not shown) so that the thin film coils 31 to 34 substantially function as a single conductor. In this case, the current Im to be detected can flow to the thin film coils 31, 32, 33, and 34 in this order or the reverse order. The thin film coil 34 is a thin film pattern made of a metal material having high conductivity such as copper like the thin film coils 31 to 33.

Figure 18:
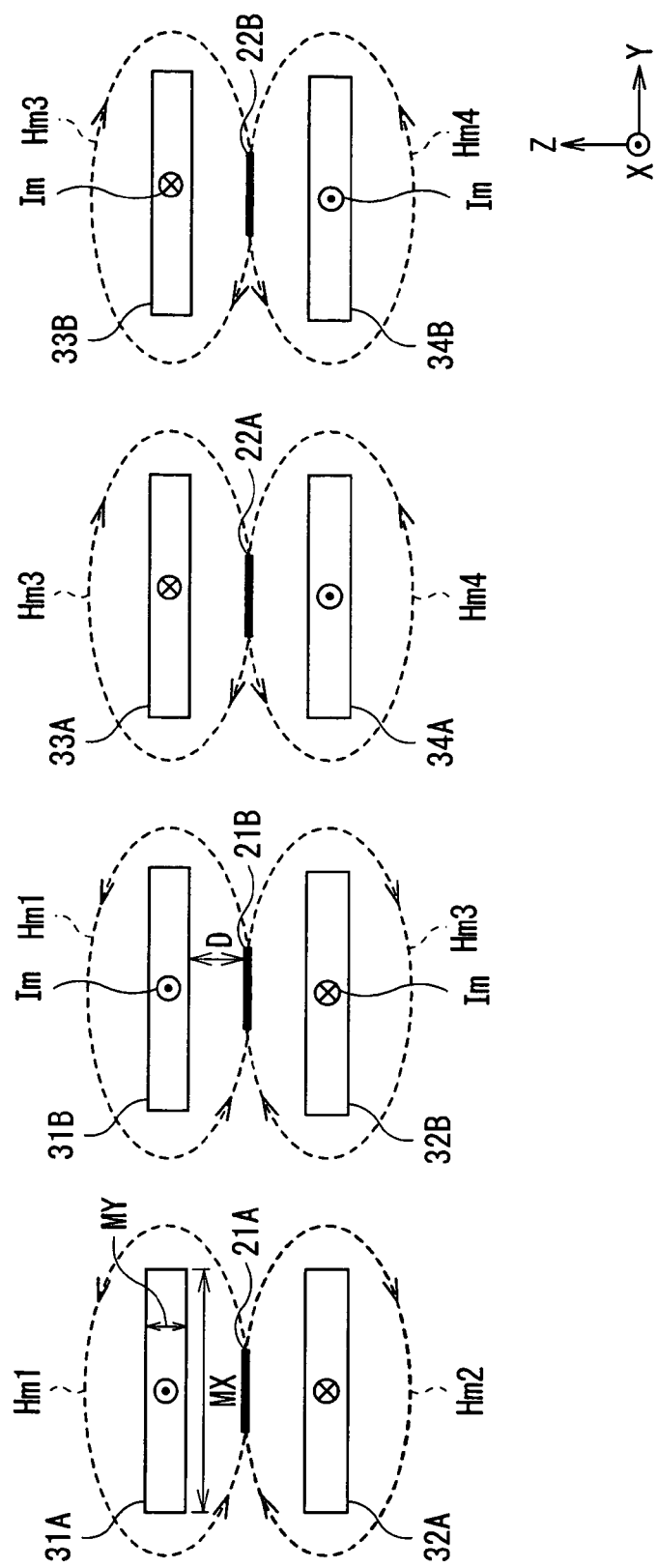
FIG. 18 is an enlarged cross section of a main part of FIG. 17.

In the current sensor 1D having such a configuration, as shown in FIG. 18, when the current Im to be detected flows in the thin film coils 31 and 32, the two current magnetic fields Hm1 and Hm2 act on the first magnetoresistive element 21. Simultaneously, when the current Im to be detected flows in the thin film coils 33 and 34, the two current magnetic fields Hm3 and Hm4 act on the second magnetoresistive element 22. FIG. 18 is an enlarged view of a part of FIG. 17 and illustrates the action of the current magnetic fields Hm1 and Hm2 on the element patterns 21A and 21B and the action of the current magnetic fields Hm3 and Hm4 on the element patterns 22A and 22B.

In the case of performing sensing by using the current sensor 1D, first, a sense current flows to the first magnetoresistive element 21 (the element patterns 21A and 21B) and a sense current flows to the second magnetoresistive element 22 (the element patterns 22A and 22B) via the electrode films 43 and 44. Next, the current Im to be detected is supplied to the thin film coils 31 and 32 via the electrode films 41 and 42, and the current magnetic field Hm1 generated by the winding body portions 31A and 31B and the current magnetic field Hm2 generated by the winding body portions 32A and 32B are detected by the element patterns 21A and 21B. Similarly, the current Im to be detected is supplied to the thin film coils 33 and 34 via the electrode films 45 and 46, and the current magnetic field Hm3 generated by the winding body portions 33A and 33B and the current magnetic field Hm4 generated by the winding body portions 34A and 34B are detected by the element patterns 22A and 22B.

For example, a case will be considered in which the electrode films 42 and 45 are connected to each other via an external conductor, the current Im to be detected sent via the thin film coils 31 and 32 in order is passed so as to flow from the end 33S of the thin film coil 33 to the end 33E, and subsequently, from the end 34S to the end 34E of the thin film coil 34. In this case, as shown in FIG. 18, in the winding body portions 33A and 33B, the current Im to be detected flows in the −X direction (from this side to the back in the drawing sheet). As a result, the current magnetic field Hm3 winding around each of the winding body portions 33A and 33B (in a clockwise direction in the drawing sheet) according to the right-handed screw rule is generated. On the other hand, in the winding body portions 34A and 34B, the current Im to be detected flows in the +X direction (from the back to this side in the drawing sheet). As a result, the current magnetic field Hm4 winding around each of the winding body portions 34A and 34B (in a counterclockwise direction in the drawing sheet) according to the right-handed screw rule is generated. Consequently, a magnetic field obtained by combining the current magnetic fields Hm3 and Hm4 in the −Y direction is applied to each of the element patterns 22A and 22B. Therefore, as compared with the case of applying only the current magnetic field Hm3 to the second magnetoresistive element 22 as in the third embodiment, the intensity of the magnetic field applied to the element patterns 22A and 22B is higher and the change amount of the resistance value is larger. By detecting the difference between the change amount of the voltage drop (the change amount of the resistance value) between the electrode patterns 4 and 5 and the change amount of the voltage drop (the change amount of the resistance value) between the electrode patterns 6 and 5, the magnitude of the current Im to be detected can be estimated with higher precision.

As described above, the current sensor 1D detects the current magnetic fields Hm1 and Hm2 generated by the current Im to be detected by the first magnetoresistive element 21, and the current magnetic fields Hm3 and Hm4 generated by the current Im to be detected by the second magnetoresistive element 22. Consequently, while maintaining the compact configuration, the current Im to be detected which flows in the thin film coils 31 to 34 can be measured with higher precision by both of the first and second magnetoresistive elements 21 and 22. In particular, the element patterns 22A and 22B are constructed so that the resistance value changes in the direction opposite to a change in the element patterns 21A and 21B of the first magnetoresistive element 21 generated by the current magnetic fields Hm1 and Hm2 when the current magnetic fields Hm3 and Hm4 are applied, and the constant currents I0 which are equal to each other flow to the first and second magnetoresistive elements 21 and 22. Consequently, on the basis of the difference between voltage drops which occur at that time, the current Im to be detected can be measured with higher precision.

Although the present invention has been described by the embodiments above, the invention is not limited to the foregoing embodiments but can be variously modified. For example, although the magnetoresistive element having the spin valve structure in which the magnetization direction of the pinned layer and the direction of the easy axis of magnetization of the free layer coincide with each other is employed, the invention is not limited to the configuration. For example, a magnetoresistive element having a spin valve structure in which the magnetization direction of a pinned layer and the direction of the axis of easy magnetization are orthogonal to each other may be used.

Figure 19:
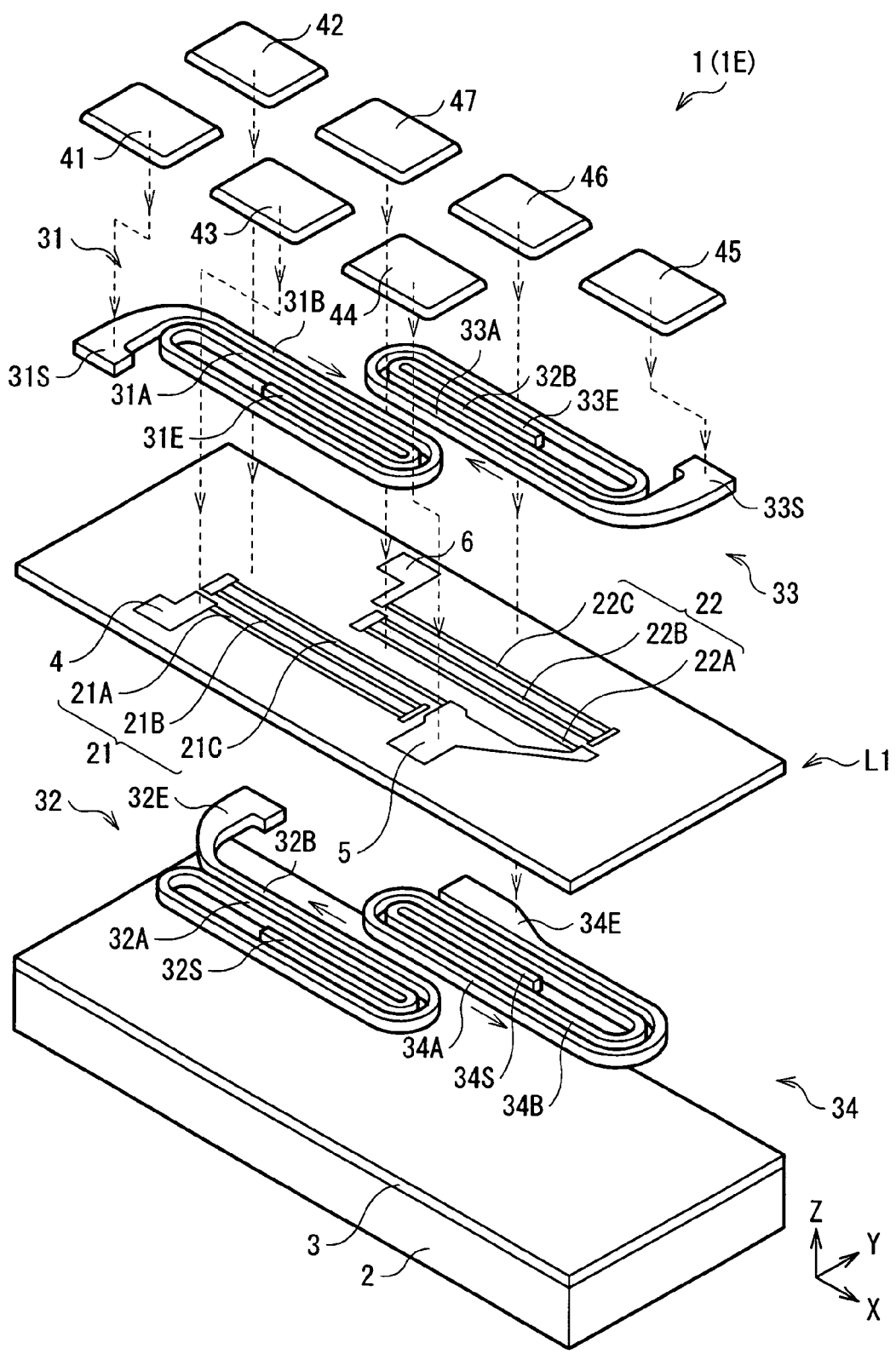
FIG. 19 is a perspective view showing the configuration of a current sensor as a modification of the current sensor illustrated in FIG. 16.

In the embodiments, each of the first and second magnetoresistive elements is constructed by two element patterns. However, the invention is not limited to the configuration. Each of the first and second magnetoresistive elements may be constructed by three or more element patterns. Further, in the embodiments, the element patterns in the first and second magnetoresistive elements are connected in parallel to each other. Alternately, for example, like a current sensor 1E shown in FIG. 19, the element patterns may be connected to each other in series. In such a case, the total length of the element patterns functioning as a magnetosensitive part can be increased without increasing the dimension in the first direction, and the absolute values of general resistance values (impedances) of the first and second magnetoresistive elements can be further increased. Therefore, high-precision measurement can be performed even with a weaker current to be detected.

The current sensor of the invention is used to measure a current value itself as described in the foregoing embodiments and can be also applied for an eddy current inspection technique for inspecting a defective in printed wiring and the like. In an example of application, a current sensor is constructed by arranging a number of element patterns on a straight line and senses a change in an eddy current as a change in a magnetic flux.

What is claimed is:

1. A current sensor comprising:
   a first magnetoresistive element including a plurality of strip-shaped element patterns which extend in a first direction at a first level and are disposed so as to be adjacent to each other in a second direction orthogonal to the first direction; and
   a first thin film coil which includes a plurality of first winding body portions extending in the first direction in correspondence with each of the element patterns in the first magnetoresistive element, winds at a second level different from the first level, and applies a first current magnetic field from each of the plurality of first winding body portions to each of the element patterns in the first magnetoresistive element when a current to be detected is supplied.

2. A current sensor according to claim 1, wherein the element patterns in the first magnetoresistive element are connected in parallel to each other.

3. A current sensor according to claim 1, wherein the element patterns in the first magnetoresistive element are connected in series to each other.

4. A current sensor according to claim 1, further comprising a second thin film coil which includes a plurality of second winding body portions extending in the first direction in correspondence with each of the element patterns in the first magnetoresistive element and winds at a third level positioned on the side opposite to the second level with respect to the first level, and applies a second current magnetic field in the same direction as that of the first current magnetic field from each of the plurality of second winding body portions to each of the element patterns in the first magnetoresistive element when the current to be detected is supplied.

5. A current sensor according to claim 1, wherein each of the element patterns in the first magnetoresistive element has a magnetization pinned film magnetized in the first direction.

6. A current sensor according to claims 1, wherein each of the element patterns in the first magnetoresistive element has a longitudinal dimension in the first direction which is 10 to 200 times as large as a width dimension in the second direction.

7. A current sensor according to claim 6, wherein the width dimension in the second direction lies in a range from 0.5 μm to 2.0 μm.

8. A current sensor according to claim 1, further comprising:
   a second magnetoresistive element including a plurality of strip-shaped element patterns which extend in the first direction at a first level and are disposed so as to be adjacent to each other in the second direction, and formed in an area other than an area in which the first magnetoresistive element at the first level is formed so as to be connected to the first magnetoresistive element in common; and a third thin film coil which includes a plurality of third winding body portions extending in the first direction in correspondence with the element patterns in the second magnetoresistive element, winds in an area other than an area in which the first thin film coil at the second level is formed, and applies a third current magnetic field from each of the plurality of third winding body portions to each of the element patterns in the second magnetoresistive element when the current to be detected is supplied.

9. A current sensor according to claim 8, wherein a resistance value in each of the element patterns of the second magnetoresistive element changes in a direction opposite to that of a change in the resistance value of each of the element patterns of the first magnetoresistive element which is caused by the first current magnetic field when the third current magnetic field is applied.

10. A current sensor according to claim 8, further comprising:

a second thin film coil which includes a plurality of second winding body portions extending in the first direction in correspondence with each of element patterns of the first magnetoresistive element and winds at a third level positioned on the side opposite to the second level with respect to the first level, and applies a second current magnetic field in the same direction as that of the first current magnetic field from each of the plurality of second winding body portions to each of the element patterns in the first magnetoresistive element when the current to be detected is supplied; and a fourth thin film coil which includes a plurality of fourth winding body portions extending in the first direction in correspondence with each of the element patterns in the second magnetoresistive element and winds in an area other than an area in which the second thin film coil at the third level is formed, and applies a fourth current magnetic field in the same direction as that of the third current magnetic field from each of the plurality of fourth winding body portions to each of the element patterns in the second magnetoresistive element when the current to be detected is supplied.

11. A current sensor according to claim 10, wherein a resistance value in each of the element patterns of the second magnetoresistive element changes in a direction opposite to that of a change in the resistance value of each of the element patterns of the first magnetoresistive element which is caused by the first and second current magnetic fields when the third and fourth current magnetic fields are applied.

12. A current sensor according to claim 8, wherein the element patterns in the first and second magnetoresistive elements are connected in parallel to each other.

13. A current sensor according to claim 8, wherein the element patterns in the first and second magnetoresistive elements are connected in series to each other.

14. A current sensor according to claim 8, wherein the first and second magnetoresistive elements are formed on the same substrate.

15. A current sensor according to claim 8, wherein each of the element patterns in the first and second magnetoresistive elements has a magnetization pinned film magnetized in the first direction.

16. A current sensor according to claim 8, wherein each of the element patterns in the first and second magnetoresistive elements has a longitudinal dimension in the first direction which is 10 to 200 times as large as a width dimension in the second direction.

17. A current sensor according to claim 16, wherein the width dimension lies in a range from 0.5 μm to 2.0 μm.

* * * * *